(12) United States Patent
Yokota et al.

(10) Patent No.: US 12,416,869 B2
(45) Date of Patent: Sep. 16, 2025

(54) IMAGE DEVICE AND MOTHERBOARD FOR IMAGE DEVICE

(71) Applicant: SEIKO EPSON CORPORATION, Tokyo (JP)

(72) Inventors: Tomoki Yokota, Suwa (JP); Kikuya Morita, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 681 days.

(21) Appl. No.: 17/732,503

(22) Filed: Apr. 28, 2022

(65) Prior Publication Data

US 2022/0350267 A1    Nov. 3, 2022

(30) Foreign Application Priority Data

Apr. 30, 2021    (JP) ................... 2021-077279

(51) Int. Cl.
*G03F 9/00* (2006.01)
*G02B 5/28* (2006.01)
*H05K 13/00* (2006.01)

(52) U.S. Cl.
CPC ........... *G03F 9/7076* (2013.01); *G02B 5/285* (2013.01); *G03F 9/708* (2013.01); *H05K 13/0015* (2013.01)

(58) Field of Classification Search
CPC .... G03F 9/7076; G03F 9/708; H05K 13/0015
See application file for complete search history.

(56) References Cited

U.S. PATENT DOCUMENTS

| 11,024,698 | B2 | 6/2021 | Tamura |
| 2002/0164077 | A1 | 11/2002 | Lee et al. |
| 2013/0221439 | A1* | 8/2013 | Shimizu ............. B81C 1/00603 |
| | | | 438/479 |
| 2014/0147984 | A1* | 5/2014 | Zhang ................. H01L 23/5227 |
| | | | 257/774 |
| 2019/0123124 | A1 | 4/2019 | Tamura |
| 2021/0375780 | A1* | 12/2021 | Huang ................. H01L 23/544 |
| 2022/0093692 | A1* | 3/2022 | Li ...................... H10K 59/8792 |

FOREIGN PATENT DOCUMENTS

| JP | H06186515 | 7/1994 |
| JP | 2013-089881 | 5/2013 |
| JP | 2013115192 | 6/2013 |
| JP | 2014-179446 | 9/2014 |
| WO | 2018020844 | 2/2018 |

\* cited by examiner

*Primary Examiner* — Eliseo Ramos Feliciano
*Assistant Examiner* — Mikka Liu
(74) *Attorney, Agent, or Firm* — JCIPRNET

(57) ABSTRACT

At a motherboard for an image device, which is used for manufacturing an image device such as a liquid crystal device, an organic electroluminescence device, a mirror device, and an image-capturing device, a mark for alignment is provided on an outer side of a pixel area in which a plurality of pixels are arranged. In the photo-lithography process, a light exposure mask is arranged by using the mark as a reference position. For the mark, a recessed portion provided in a motherboard main body is filled with a filling film. The recessed portion includes a first groove extending along a first direction and a second groove extending along a second direction intersecting with the first direction, the second groove not intersecting with the first groove in plan view.

12 Claims, 17 Drawing Sheets

IMAGE DEVICE AND MOTHERBOARD FOR IMAGE DEVICE

The present application is based on, and claims priority from JP Application Serial Number 2021-077279, filed Apr. 30, 2021, the disclosure of which is hereby incorporated by reference herein in its entirety.

BACKGROUND

1. Technical Field

The present disclosure relates to an image device that enables displaying and imaging and a motherboard for an image device.

2. Related Art

An image device such as a liquid crystal device, a display device including a light-emitting element such as an organic electroluminescence element, a mirror device, and an image sensor obtained by combining a photoreceptor element and a lens performs displaying and imaging with a plurality of pixels provided in a pixel area. In a process of manufacturing the image device, a semiconductor process such as a photo-lithography process is utilized to form various elements, wiring lines, and the like on a substrate body. Further, in order to expose a resist to light in the photo-lithography process, a mark is formed at the substrate body, and a light exposure mask is positioned by utilizing the mark, for example. The mark has a structure obtained by filling, with a filling film, a quadrangular or cross-like recessed portion formed in the substrate body, for example (see JP-A-2013-89881).

In a case in which the mark is formed, when the recessed portion is formed to have a quadrangular shape, an opening width is large, and hence there is a difficulty in filling the recessed portion with the filling film in an appropriate manner. Further, when the recessed portion is formed to have a cross-like shape, an opening width in an oblique direction with respect to both a first groove and a second groove is large at a crossing portion of the first groove extending in a first direction and the second groove extending in a second direction, and hence there is a difficulty in filling the recessed portion with the filling film in an appropriate manner. In such a case, there arises a problem in that a crack or the like generated in the recessed portion due to stress may make it difficult to recognize the mark.

SUMMARY

In order to solve the above-mentioned problem, an image device according to an aspect of the present disclosure includes a substrate body and a mark including a recessed portion provided in the substrate body and a filling film filled in the recessed portion. The recessed portion includes a first groove extending along a first direction and a second groove extending along a second direction intersecting with the first direction, the second groove not intersecting with the first groove in plan view.

A motherboard for an image device according to an aspect of the present disclosure includes a motherboard main body and a mark including a recessed portion provided in the motherboard main body and a filling film filled in the recessed portion. The recessed portion includes a first groove extending along a first direction in an in-plane direction of the motherboard main body and a second groove extending along a second direction intersecting with the first direction, the second groove not intersecting with the first groove in plan view.

In another aspect of the present disclosure, a method of manufacturing an image device includes forming a mark as a reference, the mark including a recessed portion recessed on an outer side of a pixel area in which a plurality of pixels are arranged. In the method, the recessed portion including a first groove and a second groove is formed. The first groove extends in a first direction in an in-plane direction of a substrate body, and the second groove extends in a second direction intersecting with the first groove, the second groove not intersecting with the first groove in the in-plane direction. After forming the recessed portion, a filling film fills the recessed portion.

DESCRIPTION OF EXEMPLARY EMBODIMENTS

Figure 1:
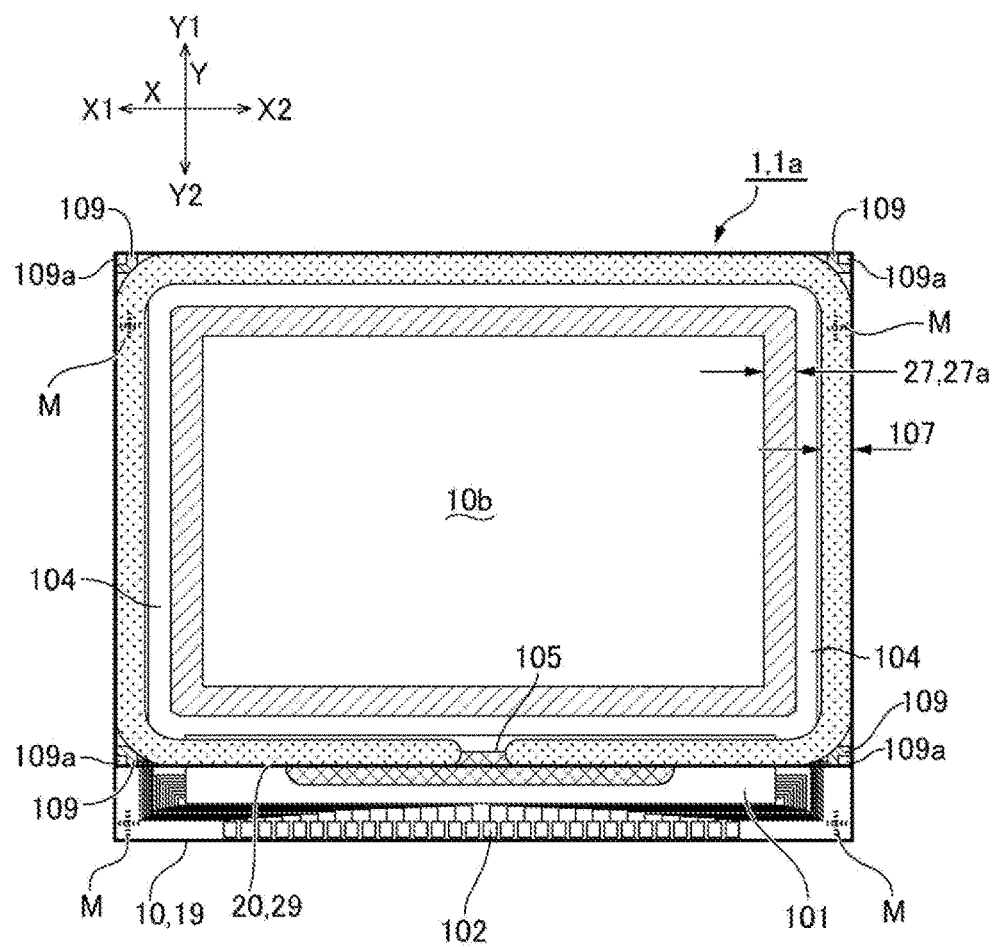
FIG. 1 is a plan view illustrating an aspect of an image device according to a first exemplary embodiment of the present disclosure.

Exemplary embodiments of the present disclosure will be described below with reference to the drawings. An "image device" according to the present disclosure means a display device that displays an image or an image-capturing device that captures an image. Therefore, in the following description, an application example to a liquid crystal device 1a, an application example to an organic electroluminescence device 1b, an application example to a mirror device 1c, and an application example to an image-capturing device 1d are described in a first exemplary embodiment, a second exemplary embodiment, a third exemplary embodiment, and a fourth exemplary embodiment, respectively. Note that, in each of the figures to be referred to in the following description, to illustrate each layer, each member, and the like in a recognizable size in the drawings, each layer, each member, and the like are illustrated at a different scale. Further, in the following description, a first direction of two directions intersecting with each other in an in-plane direction of an element substrate 10 is denoted with X, and a second direction intersecting with the first direction X is denoted with Y.

1. First Exemplary Embodiment: Application Example to Liquid Crystal Device 1a 1-1. Configuration of Image Device 1

Figure 2:
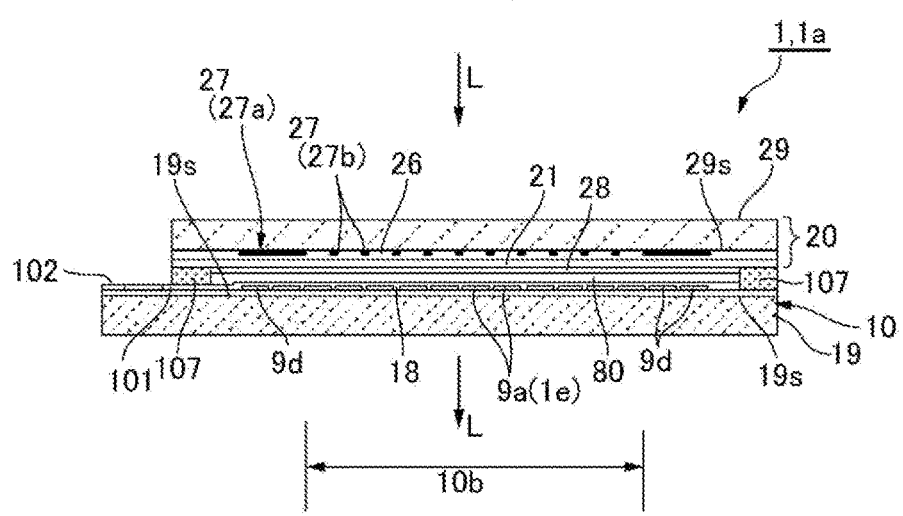
FIG. 2 is a cross-sectional view of the image device illustrated in FIG. 1.

FIG. 1 is a plan view illustrating an aspect of an image device 1 according to the first exemplary embodiment of the present disclosure. FIG. 2 is a cross-sectional view of the image device 1 illustrated in FIG. 1. The image device 1 illustrated in FIG. 1 and FIG. 2 corresponds to the liquid crystal device 1a. In the liquid crystal device 1a, the element substrate 10 including a substrate body 19 and a counter substrate 20 including a substrate body 29 are bonded to each other through intermediation of a sealing material 107 at a predetermined gap, and an electro-optical layer 80 is arranged in a region surrounded by the sealing material 107 between the element substrate 10 and the counter substrate 20. A pixel area 10b is provided to the substantially center part of the image device 1.

The substrate body 19 is formed of a quartz substrate, a glass substrate, or the like. At one surface 19s side of the substrate body 19, on an outer side of the pixel area 10b, a data line driving circuit 101 and a plurality of terminals 102 are formed along one side of the substrate body 19. A scanning line driving circuit 104 is formed along other sides adjacent to the one side. A flexible wiring substrate (not illustrated) is coupled to the terminals 102.

In the pixel area 10b on the one surface 19s of the substrate body 19, pixels 1e including a plurality of pixel electrodes 9a being transmissive and being formed of an Indium Tin Oxide (ITO) film or the like and a transistor (not illustrated in FIG. 1 and FIG. 2) electrically coupled to each of the plurality of pixel electrodes 9a are formed in a matrix shape. A first alignment film 18 is formed at the counter substrate 20 side with respect to the pixel electrodes 9a. Therefore, the element substrate 10 corresponds to a part from the substrate body 19 to the first alignment film 18. At a region on an outer side of the pixel area 10b of the substrate body 19, marks M described later are formed.

The substrate body 29 is formed of a quartz substrate, a glass substrate, or the like. At one surface 29s side of the substrate body 29, a light-transmitting common electrode 21 being formed of an ITO film or the like is formed. The common electrode 21 is formed substantially entirely at the counter substrate 20. A second alignment film 28 is formed at the element substrate 10 side with respect to the common electrode 21. Therefore, the counter substrate 20 corresponds to a part from the substrate body 29 to the second alignment film 28. At the counter substrate 20, a light-shielding layer 27 having a light-shielding property and being formed of a metal or a metal compound is formed between the substrate body 29 and the common electrode 21, and a protective layer 26 being transmissive is formed between the light-shielding layer 27 and the common electrode 21. The light-shielding layer 27 is formed, for example, as a partition 27a in a frame-like shape extending along the outer peripheral edge of the pixel area 10b. In some cases, the light-shielding layer 27 is formed as a black matrix 27b in regions that overlap with regions in plan view, each of which is sandwiched between the pixel electrodes 9a adjacent to each other. Regions overlapping, when viewed in plan view, with the partition 27a at the substrate body 19 are formed with dummy pixel electrodes 9d formed simultaneously with the pixel electrodes 9a.

The first alignment film 18 and the second alignment film 28 are inorganic alignment films including diagonally vapor-deposited films of $SiO_x$ ($x<2$), $SiO_2$, $TiO_2$, MgO, $Al_2O_3$, and the like, where liquid crystal molecules having negative dielectric anisotropy used for the electro-optical layer 80 are tilt-oriented. Therefore, the liquid crystal molecules form a predetermined angle with respect to the substrate body 19 and the substrate body 29. In this way, the image device 1 is configured as a liquid crystal device of a Vertical Alignment (VA) mode.

At the element substrate 10, inter-substrate conduction electrodes 109 for establishing electrical conduction between the element substrate 10 and the counter substrate 20 are formed in regions overlapping with corner portions of the substrate body 29 on the outer side of the sealing material 107. An inter-substrate conduction material 109a containing conductive particles is arranged at the inter-substrate conduction electrode 109, where the common electrode 21 of the counter substrate 20 is electrically coupled to the element substrate 10 side via the inter-substrate conduction material 109a and the inter-substrate conduction electrode 109. Hence, a common potential is applied to the common electrode 21 from the element substrate 10 side.

In the image device 1 of the present exemplary embodiment, the pixel electrodes 9a and the common electrode 21 are formed of an ITO film, and the image device 1 is configured as a transmissive liquid crystal device. In the image device 1 described herein, an image is displayed in a manner that light incident on the electro-optical layer 80 from one of the element substrate 10 and the counter substrate 20 is modulated while being emitted through the other one of the substrates. In the present exemplary embodiment, as indicated by the arrow L, an image is displayed in a manner that light incident from the counter substrate 20 is modulated by the electro-optical layer 80 for each of the pixels while being emitted through the element substrate 10.

1-2. Overall Configuration of Pixel 1e

Figure 3:
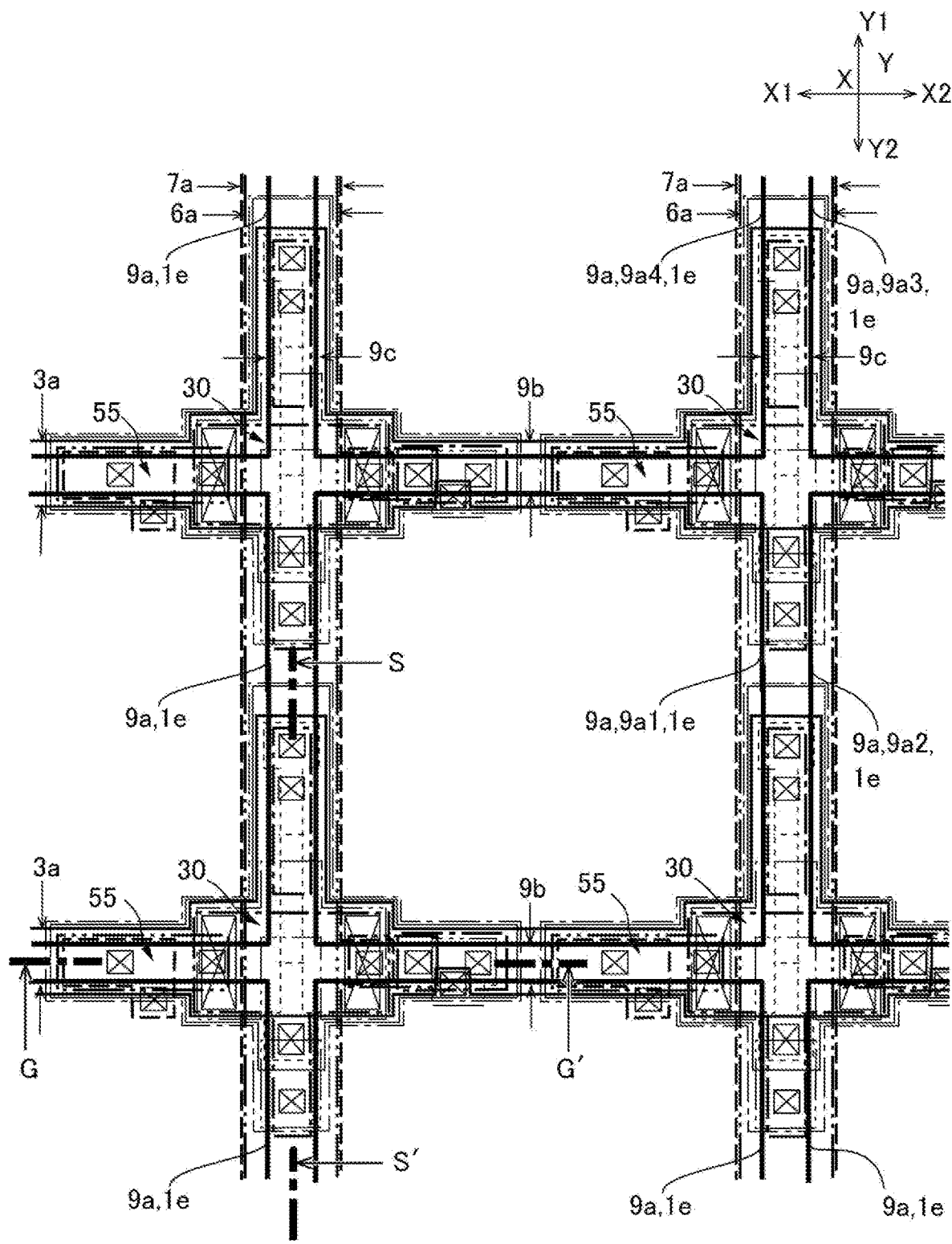
FIG. 3 is a plan view of a plurality of pixels adjacent to each other in the image device illustrated in FIG. 1.
Figure 4:
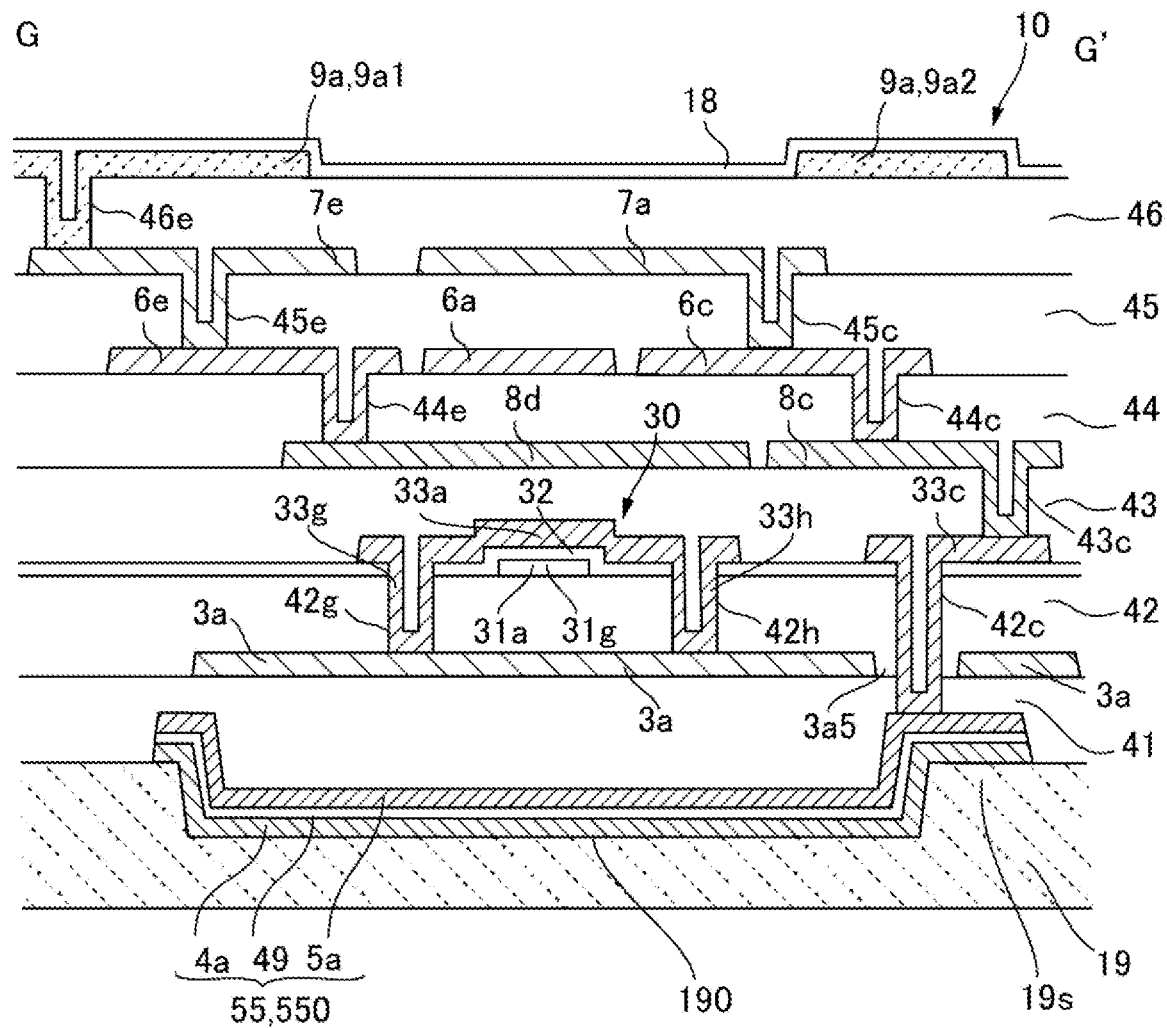
FIG. 4 is a cross-sectional view of a vicinity of a transistor illustrated in FIG. 3, which is taken along the line G-G'.
Figure 5:
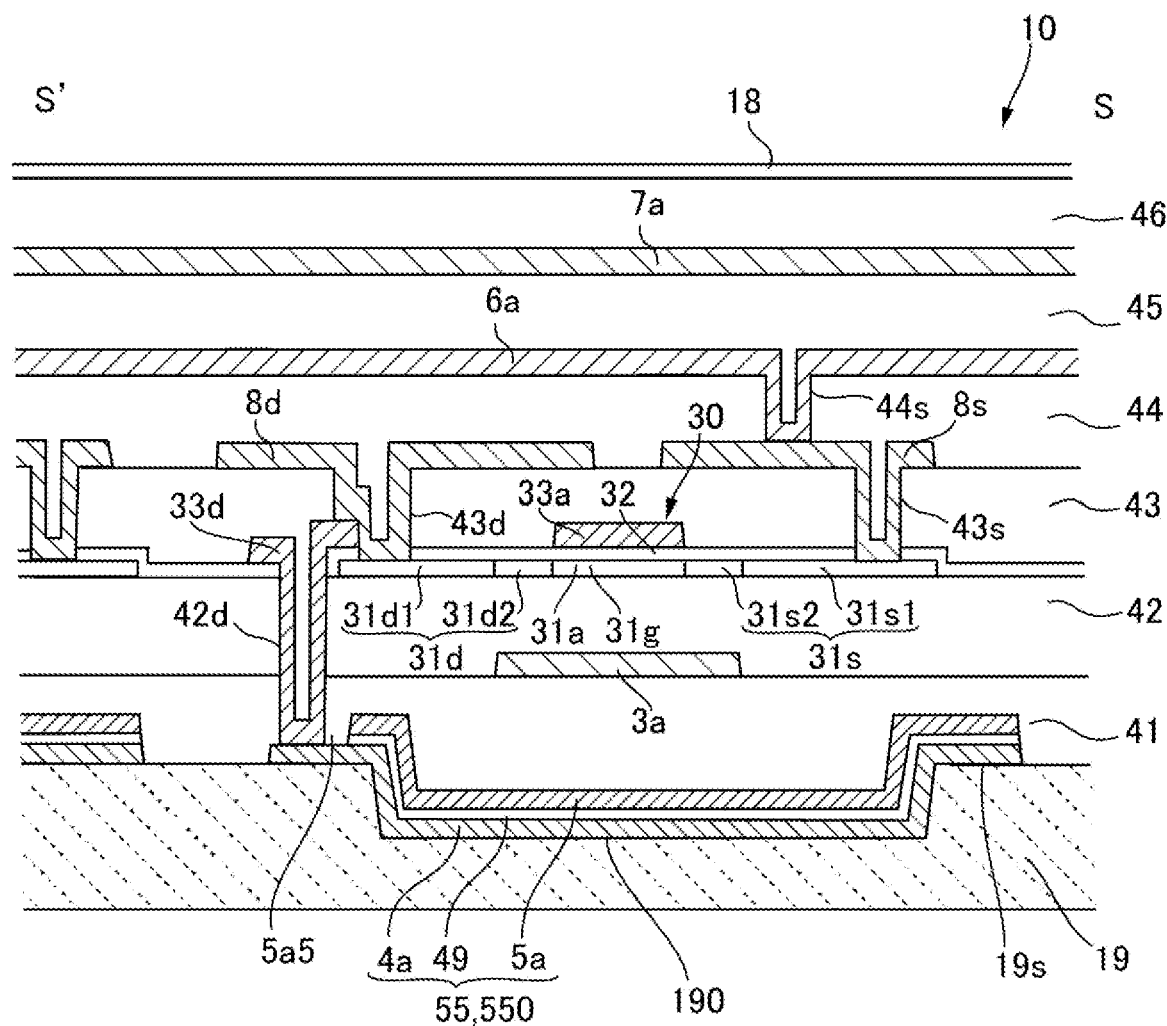
FIG. 5 is a cross-sectional view of the vicinity of the transistor illustrated in FIG. 3, which is taken along the line S-S'.

FIG. 3 is a plan view of the plurality of pixels 1e adjacent to each other in the image device 1 illustrated in FIG. 1. FIG. 4 is a cross-sectional view of a vicinity of a transistor 30 illustrated in FIG. 3, which is taken along the line G-G'. FIG. 4 schematically illustrates a state in which the transistor 30 and the like are taken along a scan line 3a. Note that FIG. 4 also illustrates a cross section at a position passing through a contact hole 46e and the like. FIG. 5 is a cross-sectional view of the vicinity of the transistor 30 illustrated in FIG. 3, which is taken along the line S-S'. FIG. 5 schematically illustrates a state in which the transistor 30 and the like are taken along a data line 6a. Note that, in FIG. 3, each layer is indicated by a line described below. Further, in FIG. 3, as for layers including ends overlapping with each other in plan view, positions of the ends are displaced to make shapes and the like of the layers readily recognizable.

Scan line 3a: a thick solid line
Semiconductor film 31a: a thin and short dashed line
Gate electrode 33a: a thin two-dot chain line
First capacitance electrode 4a: a thin dot chain line
Second capacitance electrode 5a: a thin solid line
Relay electrodes 8c, 8d, 8s: a thick dot chain line
Data line 6a and relay electrodes 6c and 6e: a thick two-dot chain line
Capacitance line 7a and relay electrode 7e: a thick and long dashed line
Pixel electrode 9a: a thicker solid line As illustrated in FIG. 3, the pixel electrode 9a is formed in each of the plurality of pixels 1e at the element substrate 10, where the scan line 3a, the data line 6a, and the capacitance line 7a extend along the inter-pixel region between the pixel electrodes 9a adjacent to each other. More specifically, the scan line 3a extends in the first direction X while overlapping with a first inter-pixel region 9b extending in the first direction X, and the data line 6a and the capacitance line 7a extend in the second direction Y while overlapping with a second inter-pixel region 9c extending in the second direction Y. At the element substrate 10, the transistor 30 is formed corresponding to the intersection between the data line 6a and the scan line 3a. The scan line 3a, the data line 6a, and the capacitance line 7a have a light-shielding property. Therefore, a region in which the scan line 3a, the data line 6a, the capacitance line 7a, and a conductive film in the same layer as those lines are formed is a light-shielding region through which light is prevented from transmitting, and a region surrounded by the light-shielding region is an aperture region through which light transmits.

As illustrated in FIG. 4 and FIG. 5, in the element substrate 10, insulating films 41, 42, 43, 44, 45, and 46 as inter-layer insulating films are layered between the substrate body 19 and the pixel electrode 9a. The insulating films 41, 42, 43, 44, 45, and 46 are formed of a film being transmissive such as a silicon oxide film. Further, between the substrate body 19 and the insulating film 41, there is provided a multi-layered film 550 in which the first conductive film 4a, an insulating film 49 as a dielectric film, and a second conductive film 5a are layered sequentially from the substrate body 19 side, and the multi-layered film 550 forms a capacitance element 55. The insulating film 49 is formed of a film being transmissive such as a silicon nitride film and a silicon oxide film. When the insulating film 49 is formed of a silicon nitride film, the insulating film 49 is formed to have a film thickness from 0.01 μm to 0.03 μm. The first conductive film 4a is formed of a conductive silicon film, a metal silicide film, a metal film, a metal compound film, or the like. When the first conductive film 4a is formed of a conductive silicon film, the first conductive film 4a is formed to have a film thickness from 0.03 μm to 0.2 μm. The second conductive film 5a is formed of a conductive silicon film, a metal silicide film, a metal film, a metal compound film, or the like. When the second conductive film 5a is formed of a conductive silicon film, the second conductive film 5a is formed to have a film thickness from 0.03 μm to 0.2 μm.

A recessed portion 190 recessed toward the substrate body 19 is formed between the substrate body 19 and the capacitance element 55, and the depth of the recessed portion 190 is deeper than the total film thickness of the multi-layered film 550. Therefore, the second conductive film 5a overlaps with a side wall and a bottom wall of the recessed portion 190 via the insulating film 49 and the first conductive film 4a. Thus, the capacitance element 55 has electrostatic capacitance larger than that in a case in which the multi-layered film 550 is formed only on a flat surface. In the present exemplary embodiment, the recessed portion 190 is recessed in a surface of the substrate body 19 on the pixel electrode 9a side, toward the substrate body 19 side.

The scan line 3a is formed at a layer between the insulating film 41 and the insulating film 42. The scan line 3a is a conductive light-shielding film 3b formed of a metal silicide film, a metal film, a metal compound film, or the like. In the present exemplary embodiment, the scan line 3a is formed of a tungsten silicide film.

Between the insulating film 42 and the insulating film 43, the transistor 30 for pixel switching is formed. The transistor 30 includes the semiconductor film 31a formed at the surface of the insulating film 42 on the pixel electrode 9a side, a gate insulating film 32 covering the semiconductor film 31a from the pixel electrode 9a side, and the gate electrode 33a overlapping with a semiconductor film 31a via the gate insulating film 32 in plan view.

The gate electrode 33a is formed of a multi-layered film including a conductive polysilicon film and a metal film such as aluminum, and is electrically coupled to the scan line 3a via groove-like contact holes 42g and 42h passing through the gate insulating film 32 and the insulating film 42. The semiconductor film 31a includes a channel area 31g overlapping with the gate electrode 33a in plan view, a first source/drain region 31s adjacent to the channel area 31g on one side Y1 in the second direction Y, and a second source/drain region 31d adjacent to the channel area 31g on the other side Y2 in the second direction Y. The transistor 30 has a Lightly-Doped Drain (LDD) structure. Therefore, the second source/drain region 31d includes a high concentration region 31d1 in which a high concentration impurity is introduced at a position away from the channel area 31g, and a low concentration region 31d2 in which a low concentration impurity is introduced between the channel area 31g and the high concentration region 31d1, the concentration being lower than that in the high concentration region 31d1. The first source/drain region 31s includes a high concentration region 31s1 in which a high concentration impurity is introduced at a position away from the channel area 31g, and a low concentration region 31s2 in which a low concentration impurity is introduced between the channel area 31g and the high concentration region 31s1, the concentration being lower than that in the high concentration region 31s1. The semiconductor film 31a is formed of a polysilicon film or the like, and the gate insulating film 32 has a two-layer structure including a first gate insulating film formed of a silicon oxide film obtained by thermal oxidization of the semiconductor film 31a, and a second gate insulating film formed of a silicon oxide film formed by a low-pressure CVD method or the like.

Between the gate insulating film 32 and the insulating film 43, relay electrodes 33c and 33d are provided. The relay electrodes 33c and 33d is formed of the same conductive film as the gate electrode 33a. A contact hole 42c that passes through a notch 3a5 of the scan line 3a and reaches the second conductive film 5a is formed in the gate insulating film 32, the insulating film 42, and the insulating film 41. Therefore, the relay electrode 33c is electrically coupled to the second conductive film 5a via the contact hole 42c. Further, a contact hole 42d that passes through a notch 5a5 of the second conductive film 5a and reaches the first conductive film 4a is formed in the gate insulating film 32, the insulating film 42, and the insulating film 41. Therefore, the relay electrode 33d is electrically coupled to the first conductive film 4a via the contact hole 42d.

Between the insulating film 43 and the insulating film 44, the relay electrodes 8c, 8d, and 8s are formed. The relay electrodes 8c, 8d, and 8s are formed of a conductive film having a light shielding property such as a metal silicide film, a metal film, or a metal compound film. The relay electrode 8d is electrically coupled to the second source/drain region 31d via a contact hole 43d that passes through the insulating film 43 and the gate insulating film 32. The end of the relay electrode 33d is exposed at the contact hole 43d, and hence the relay electrode 8d is electrically coupled to the relay electrode 33d. The relay electrode 8s is electrically coupled to the first source/drain region 31s via a contact hole 43s that passes through the insulating film 43 and the gate insulating film 32. The relay electrode 8c is electrically coupled to the relay electrode 33c via a contact hole 43c that passes through the insulating film 43.

Between the insulating film 44 and the insulating film 45, the data line 6a and relay electrodes 6e and 6c are provided. The data line 6a and the relay electrodes 6c and 6e are formed of a conductive film having a light shielding property such as a metal silicide film, a metal film, or a metal compound film. The data line 6a is electrically coupled to the relay electrode 8s via a contact hole 44s that passes through the insulating film 44. The relay electrode 6e is electrically coupled to the relay electrode 8d via a contact hole 44e that passes through the insulating film 44. The relay electrode 6c is electrically coupled to the relay electrode 8c via a contact hole 44c that passes through the insulating film 44.

Between the insulating film 45 and the insulating film 46, the capacitance line 7a and a relay electrode 7e are provided. The capacitance line 7a extends in the second direction Y so as to overlap with the data line 6a in plan view. The capacitance line 7a and the relay electrode 7e are formed of a conductive film having a light shielding property such as a metal silicide film, a metal film, or a metal compound film. The capacitance line 7a is electrically coupled to the relay electrode 6c via a contact hole 45c that passes through the insulating film 45. The relay electrode 7e is electrically coupled to the relay electrode 6e via a contact hole 45e that passes through the insulating film 45.

The pixel electrode 9a is electrically coupled to the relay electrode 7e via a contact hole 46e that passes through the insulating film 46. In the present exemplary embodiment, among four pixel electrodes 9a1, 9a2, 9a3, and 9a4 adjacent to one another in the periphery of the contact hole 46e, the pixel electrode 9a1 positioned on the other side Y2 in the second direction Y with respect to the contact hole 46e is electrically coupled to the relay electrode 7e via the contact hole 46e. Therefore, the pixel electrode 9a is electrically coupled to the second source/drain region 31d via the relay electrode 7e, the relay electrode 6e, and the relay electrode 8d. Therefore, when the transistor 30 is in an on-state, an image signal is supplied from the data line 6a to the pixel electrode 9a. Further, the pixel electrode 9a is electrically coupled to the first conductive film 4a of the capacitance element 55 via the relay electrode 7e, the relay electrode 6e, the relay electrode 8d, and the relay electrode 33d.

1-3. Configuration Example of Motherboard 100 for Image Device

Figure 6:
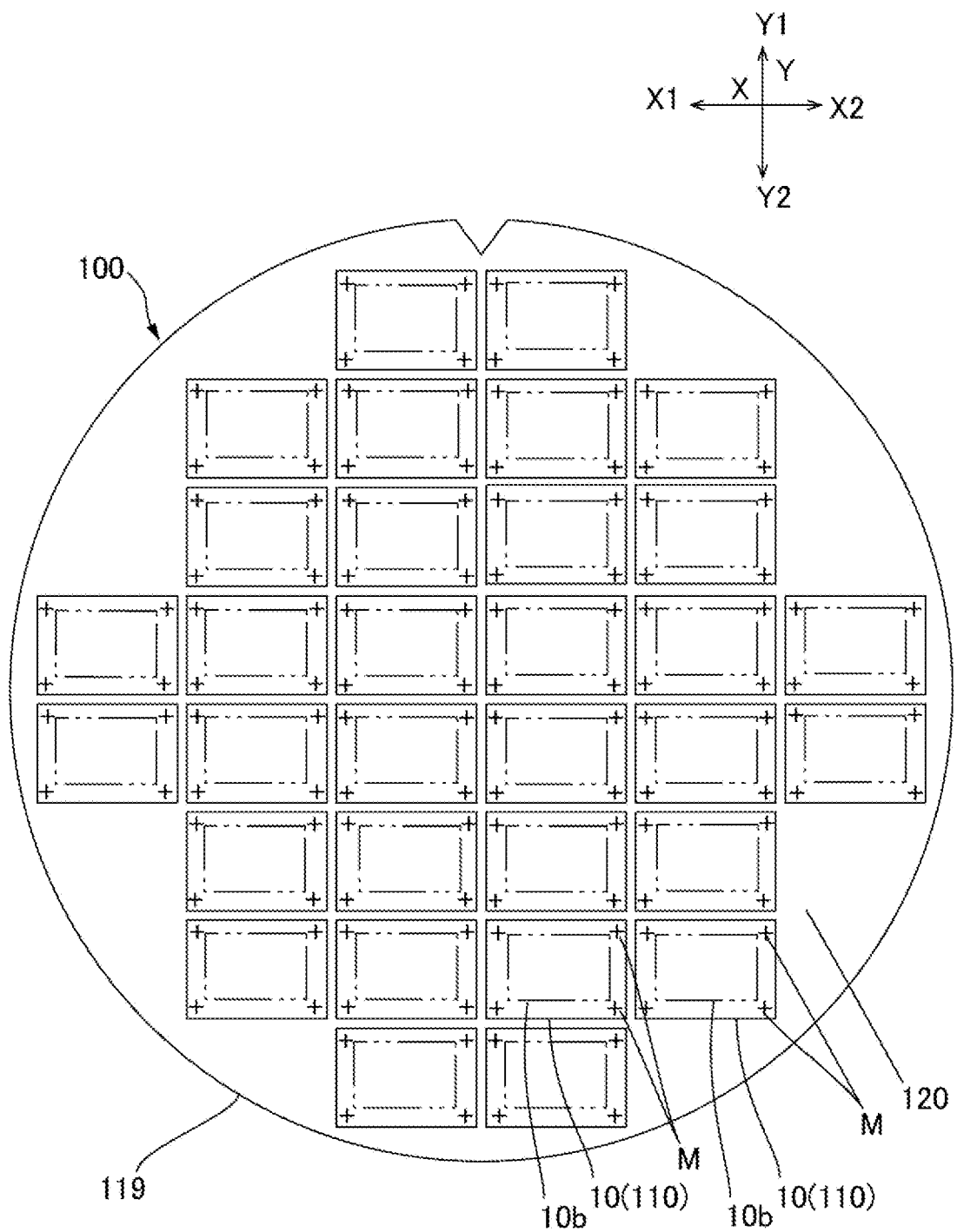
FIG. 6 is an explanatory view of a motherboard for an image device according to the first exemplary embodiment of the present disclosure.

FIG. 6 is an explanatory view of a motherboard 100 for an image device according to the first exemplary embodiment of the present disclosure. The motherboard 100 for an image device illustrated in FIG. 6 is a large substrate for manufacturing the plurality of element substrates 10 at the same. Therefore, on the motherboard 100 for an image device, a motherboard main body 119 is formed to have substantially the same structure as the element substrate 10 including the mark M and a filling film 40, and then is divided. Further, in a process of manufacturing the image device 1, the electrodes, the lines, the contact holes, and the like of the element substrate 10 are formed in the following manner. In a photo-lithography process, under a state of the motherboard 100 for an image device illustrated in FIG. 6, a resist is exposed to light via a light exposure mask, development is performed, and then a resist mask is formed. After that, in an etching process, etching is performed through an opening portion of the resist mask. Thus, before the photo-lithography process, the marks M illustrated in FIG. 6 are formed as alignment marks at the motherboard 100 for an image device, and a light exposure mask is positioned with the marks M as reference positions.

The motherboard 100 for an image device includes a plurality of effective regions 110 that correspond to the element substrates 10 after division and an ineffective region 120 that is removed to obtain the element substrates 10 at the time of division. In the present exemplary embodiment, the marks M are provided on the outer side of the pixel area 10b in each of the plurality of effective regions 110. Therefore, in the image device 1 illustrated in FIG. 1, the marks M are present at the element substrate 10. For example, the marks M are present at the positions corresponding to the four corners of the element substrate 10.

1-4. First Configuration Example of Mark M

Figure 7:
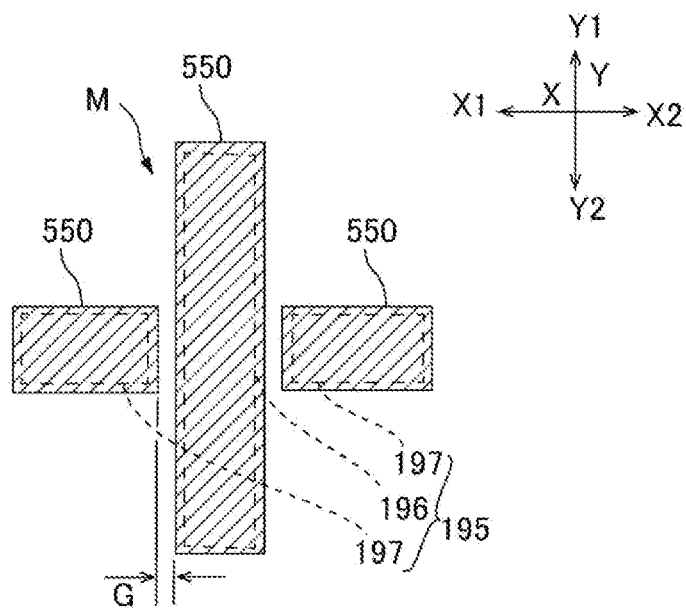
FIG. 7 is a plan view illustrating a mark illustrated in FIG. 1 in an enlarged manner.
Figure 8:
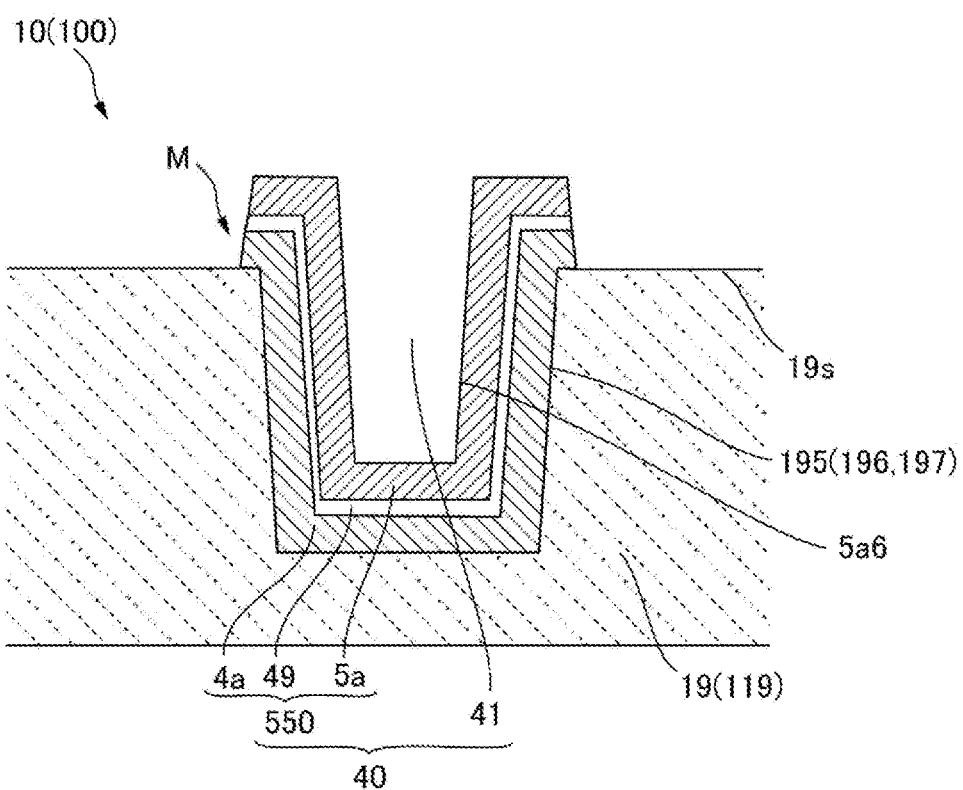
FIG. 8 is a cross-sectional view of the mark illustrated in FIG. 7.
Figure 9:
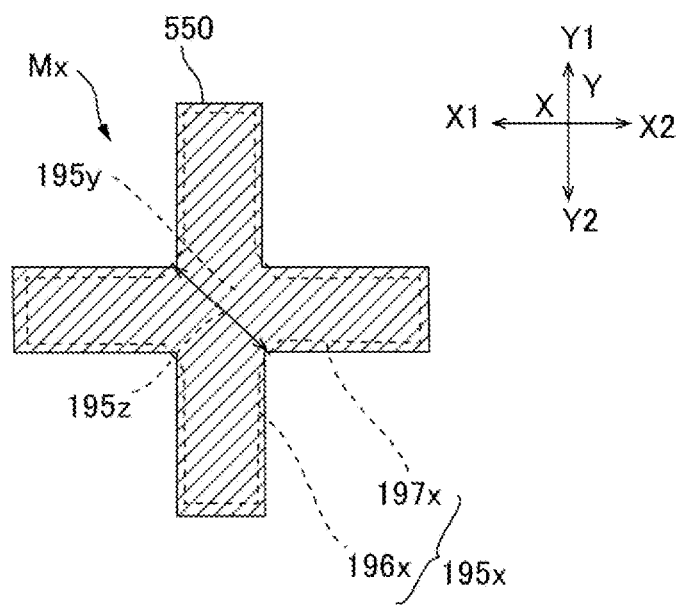
FIG. 9 is a plan view illustrating a mark according to a reference example of the present disclosure in an enlarged manner.
Figure 10:
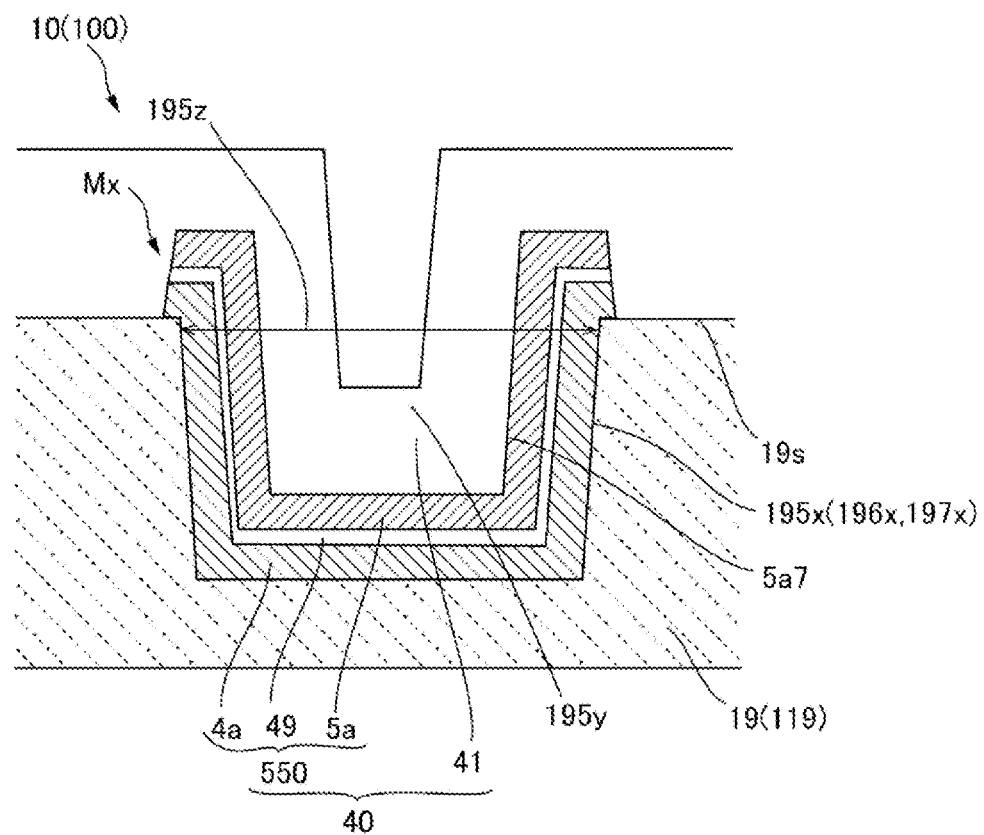
FIG. 10 is a cross-sectional view of the mark illustrated in FIG. 9.

FIG. 7 is a plan view illustrating the mark M illustrated in FIG. 1 in an enlarged manner. FIG. 8 is a cross-sectional view of the mark M illustrated in FIG. 7. FIG. 9 is a plan view illustrating a mark Mx according to a reference example of the present disclosure in an enlarged manner. FIG. 10 is a cross-sectional view of the mark Mx illustrated in FIG. 9.

In FIG. 7 and FIG. 8, the mark M includes a recessed portion 195 on the outer side of the pixel area 10b of the substrate body 19, and the filling film 40 fills the inside of the recessed portion 195. In the present exemplary embodiment, the recessed portion 195 is formed at the same layer as the recessed portion 190 illustrated in FIG. 4 and FIG. 5. More specifically, the recessed portion 195 is recessed in a surface of the substrate body 19 on the pixel electrode 9a side, toward a side opposite to the pixel electrode 9a. In the present exemplary embodiment, the substrate body 19 and the motherboard 100 for an image device are transmissive, and hence the filling film 40 includes a light-shielding film. Therefore, the mark M is visually recognizable when viewing the motherboard 100 for an image device from any planes.

The filling film 40 is formed of the multi-layered film 550 used for forming the capacitance element 55 and the insulating film 41, and the multi-layered film 550 includes the first conductive film 4a and the second conductive film 5a as light-shielding films. At the mark M, a light-shielding film including the first conductive film 4a and the second conductive film 5a is formed in a range slightly larger than the recessed portion 190. However, a planar shape and a planar size of the light-shielding film including the first conductive film 4a and the second conductive film 5a is substantially the same as a planar shape and a planar size of the recessed portion 190.

Here, the recessed portion 195 includes a first groove 196 extending in the first direction X and a second groove 197 extending in the second direction Y intersecting with the first groove 196, the second groove 197 not intersecting with the first groove 196. In the present exemplary embodiment, the recessed portion 195 includes a plurality of second grooves 197. More specifically, the second grooves 197 extend in the first direction X on both sides of a first groove 191 in the first direction X.

Each of the plurality of second grooves 197 is prevented from intersecting with the first groove 196, and extends in the first direction X intersecting with the first groove 196. More specifically, the second grooves 197 are provided at positions away from the first groove 196 across a gap G in the first direction X, and hence do not intersect with the first groove 196. Thus, a groove width of the recessed portion 195 is small at any position. Therefore, when the filling film 40 is formed, a recessed portion 5a6 is filled with a part accumulated on side walls of the first groove 196 and the second groove 197, in addition to a part accumulated on bottom walls of the first groove 196 and the second groove 197. Thus, step coverage is satisfactory. Therefore, as illustrated in FIG. 8, for example, even in a case in which the recessed portion 5a6 generated by the first groove 196 and the second groove 197 is generated in the surface of the second conductive film 5a, when the insulating film 41 is formed, the recessed portion 5a6 is readily filled with the insulating film 41. Thus, in the filling film 40, the insulating film 41 is less likely to receive a stress. With this, a crack is less likely to be generated in the insulating film 41, and a crack is less likely to develop. Therefore, observation of the mark M is not hindered by a crack, and hence the mark M is readily observed. Further, even when chemical machine polishing is performed after formation of the insulating film 41 as in the present exemplary embodiment, a film thickness for forming the insulating film 41 can be reduced, and hence a time period for forming the insulating film 41 can be shortened.

In contrast, at the mark Mx according to the reference example illustrated in FIG. 9 and FIG. 10, a first groove 196x and a second groove 197x forming a recessed portion 195x intersect with each other. Thus, at a crossing portion 195y of the first groove 196x and the second groove 197x, a groove width in a direction intersecting obliquely with the first groove 196x and the second groove 197x is wider than a design value at the time of etching. Therefore, a wide portion 195z is present at the crossing portion 195y of the first groove 196x and the second groove 197x. With this, when the filling film 40 is formed, there is a difficulty in filling the recessed portion 195x with the filling film 40 due to the portion accumulated on bottom walls and side walls of the first groove 196x and the second groove 197x. For example, in a case in which a recessed portion 5a7 generated by the first groove 196x and the second groove 197x is generated in the surface of the second conductive film 5a, when the insulating film 41 is formed, there is difficulty in filling the recessed portion 5a7 with the insulating film 41. Therefore, the insulating film 41 is more likely to receive a stress. With this, a crack is more likely to be generated in the insulating film 41, and a crack is more likely to develop. Therefore, observation of the mark M is hindered by a crack, and there is a difficulty in observing the mark M.

Further, in a case in which the wide portion 195z wider than a design value is generated at the crossing portion 195y of the first groove 196x and the second groove 197x, when the multi-layered film 550 is subjected to patterning, the recessed portion 195x projects at the crossing portion 195y from a portion in which the multi-layered film 550 is formed. With this, there is a difficulty in observing the mark M. Further, even when chemical machine polishing is performed after formation of the insulating film 41, the film thickness for forming the insulating film 41 needs to be increased, and hence a time period for forming the insulating film 41 is prolonged.

Thus, according to the exemplary embodiment described with reference to FIG. 7 and FIG. 8, a situation where the recessed portion 195 projects from the portion in which the multi-layered film 550 is formed or the like is not caused. With this, problems that may arise at the time of formation of the mark Mx illustrated in FIG. 9 and FIG. 10 can be solved. Note that, when the substrate body 19 is a substrate having a light-shielding property such as a silicon substrate, the filling film 40 may be transmissive.

1-5. Second Configuration Example of Mark M

Figure 11:
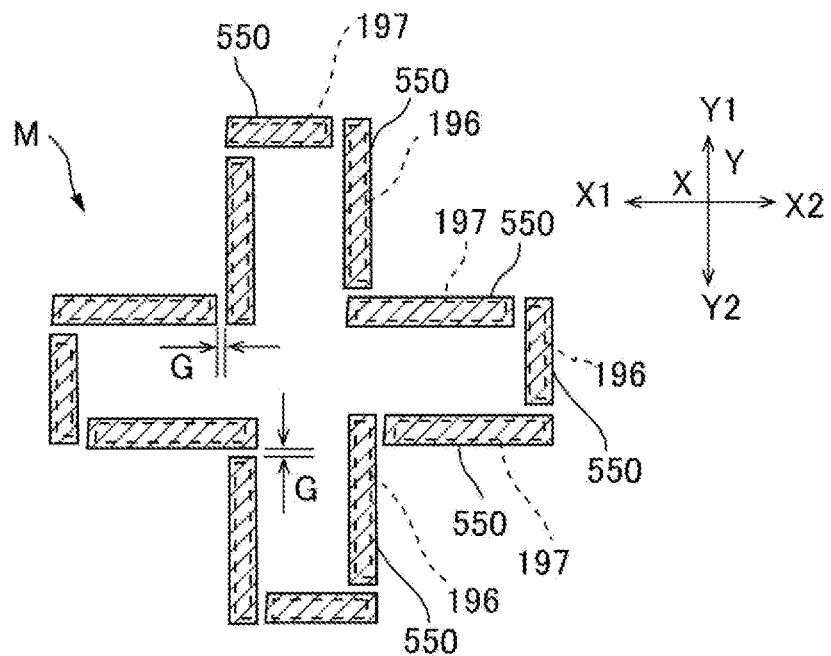
FIG. 11 is an explanatory view illustrating a second configuration example of the mark at the motherboard for an image device according to the present disclosure.

FIG. 11 is an explanatory view illustrating a second configuration example of the mark M at the motherboard 100 for an image device according to the present disclosure. Note that, in any one of the present exemplary embodiment and exemplary embodiments described later, the basic configuration of the mark M is similar to that in the exemplary embodiment described with reference to FIG. 7 and FIG. 8. Thus, common components are denoted with the same reference signs, and description therefor is omitted.

As illustrated in FIG. 11, the mark M in the present exemplary embodiment also includes the recessed portion 195, similarly to the mark M in the exemplary embodiment described with reference to FIG. 7 and FIG. 8. In the present exemplary embodiment, the recessed portion 195 includes the plurality of first grooves 196 extending in the first direction X and the plurality of second grooves 197 extending in the second direction Y intersecting with the first grooves 196, the second grooves 197 not intersecting with the first grooves 196. In the present exemplary embodiment, the mark M has a cross-like shape, and the first grooves 196 and the second grooves 197 are alternately arranged along the outer edge of the mark M. Further, the first groove 196 and the second groove 197 are away from each other across the gap G, and hence the first groove 196 and the second groove 197 do not intersect with each other. Thus, the recessed portion 195 does not include the wide portion 195z described with reference to FIG. 9 and FIG. 10. Therefore, as illustrated in FIG. 8, the recessed portion 5a6 is readily filled with the filling film 40, and hence a crack is less likely to be generated in the insulating film 41, for example. Thus, effects similar to those in the exemplary embodiment described with reference to FIG. 7 and FIG. 8 can be exerted. Moreover, the first grooves 196 and the second grooves 197 are arranged along the outline of the mark M, and hence widths of the first grooves 196 and the second grooves 197 are narrow. Therefore, according to the present exemplary embodiment, the recessed portion 5a6 is more readily filled with the filling film 40 in comparison to the exemplary embodiment described with reference to FIG. 7 and FIG. 8, and hence an effect of lowering possibility of generating a crack in the insulating film 41 and other effects can be exerted.

1-6. Third Configuration Example of Mark M

Figure 12:
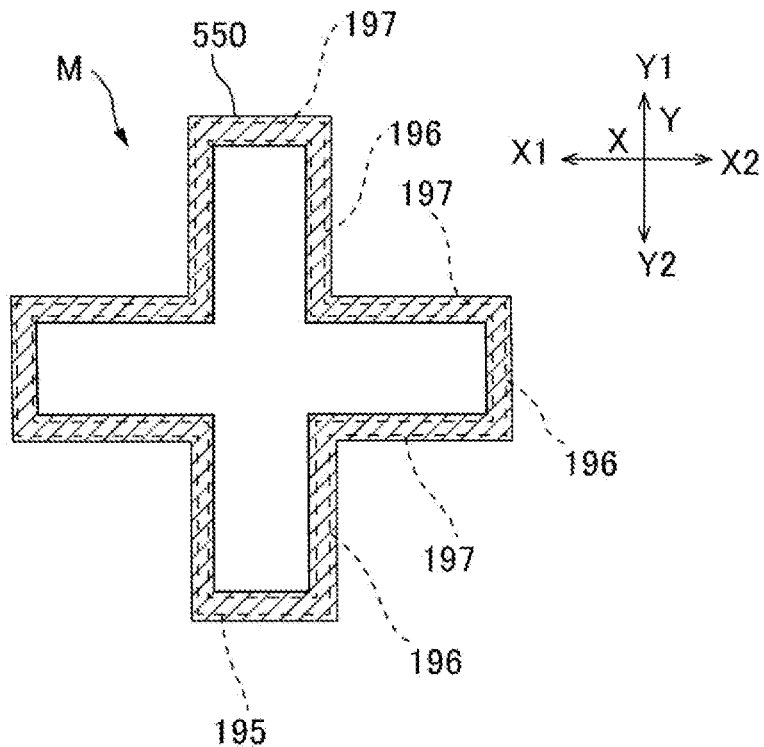
FIG. 12 is an explanatory view illustrating a third configuration example of the mark at the motherboard for an image device according to the present disclosure.

FIG. 12 is an explanatory view illustrating a third configuration example of the mark M at the motherboard 100 for an image device according to the present disclosure. The mark M illustrated in FIG. 12 corresponds to a modification example of the mark M illustrated in FIG. 11. In the case of the mark M illustrated in FIG. 11, the first grooves 196 and the second grooves 197 are not continuous. In the present exemplary embodiment, as illustrated in FIG. 12, the first grooves 196 and the second grooves 197 are continuous. Even in this exemplary embodiment, the first grooves 196 and the second grooves 197 do not intersect with each other. Therefore, the wide portion 195z described with reference to FIG. 9 and FIG. 10 is less likely to be generated at the portion where the first groove 196 and the second groove 197 are continuous with each other, and hence the recessed portion 195 is readily filled with the filling film 40.

1-7. Fourth Configuration Example of Mark M

Figure 13:
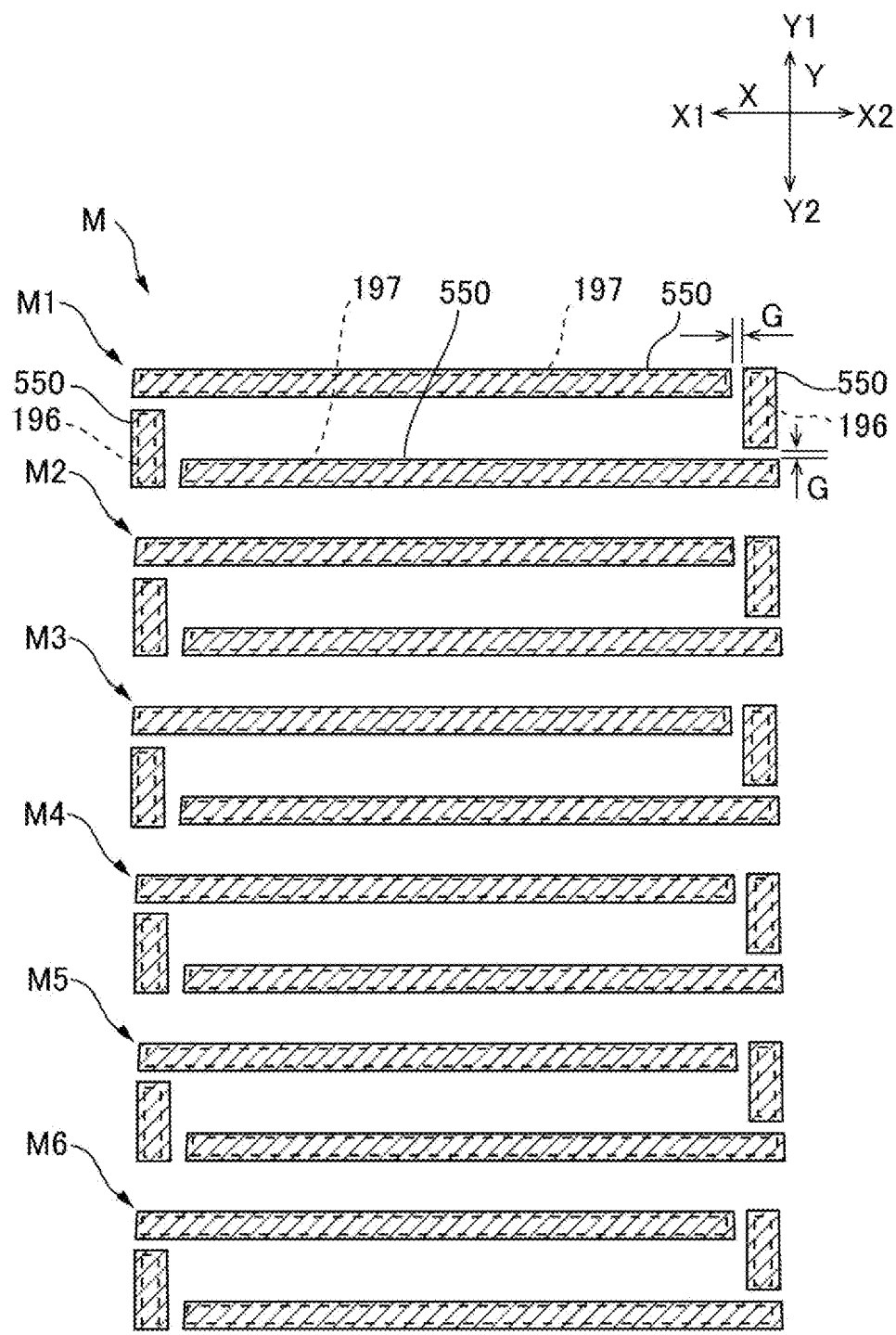
FIG. 13 is an explanatory view illustrating a fourth configuration example of the mark at the motherboard for an image device according to the present disclosure.

FIG. 13 is an explanatory view illustrating a fourth configuration example of the mark M at the motherboard 100 for an image device according to the present disclosure. As illustrated in FIG. 13, the mark M is an aggregate including a plurality of portions M1, M2, M3, M4, M5, and M6 that are arrayed in the first direction X. Each of the plurality of portions M1, M2, M3, M4, M5, and M6 includes the identical shape of recessed portion 195. In the present exemplary embodiment, the recessed portion 195 includes the first grooves 196 extending in the first direction X and the second grooves 197 extending in the second direction Y intersecting with the first grooves 196, the second grooves 197 not intersecting with the first grooves 196. In the present exemplary embodiment, the recessed portion 195 includes the plurality of first grooves 196 and the plurality of second grooves 197. More specifically, the mark M has a quadrangular frame-like shape, and the first grooves 196 and the second grooves 197 are alternately arranged along the outer edge of each of the plurality of portions, that are M1, M2, M3, M4, M5, and M6.

Further, the first groove 196 and the second groove 197 are away from each other across the gap G, and hence the first groove 196 and the second groove 197 do not intersect with each other. Thus, the wide portion 195z described with reference to FIG. 9 and FIG. 10 is not present. Therefore, as described with reference to FIG. 7 and FIG. 8, the recessed portion 195 is readily filled with the filling film 40, and hence a crack is less likely to be generated in the insulating film 41, for example. Thus, effects similar to those in the exemplary embodiment described with reference to FIG. 7 and FIG. 8 can be exerted. Moreover, the first grooves 196 and the second grooves 197 are arranged along the outline of the mark M, and hence widths of the first grooves 196 and the second grooves 197 are narrow. Therefore, according to the present exemplary embodiment, the recessed portion 195 is readily filled with the filling film 40, and hence an effect of lowering possibility of generating a crack in the insulating film 41 and other effects can be exerted.

1-8. Fifth Configuration Example of Mark M

Figure 14:
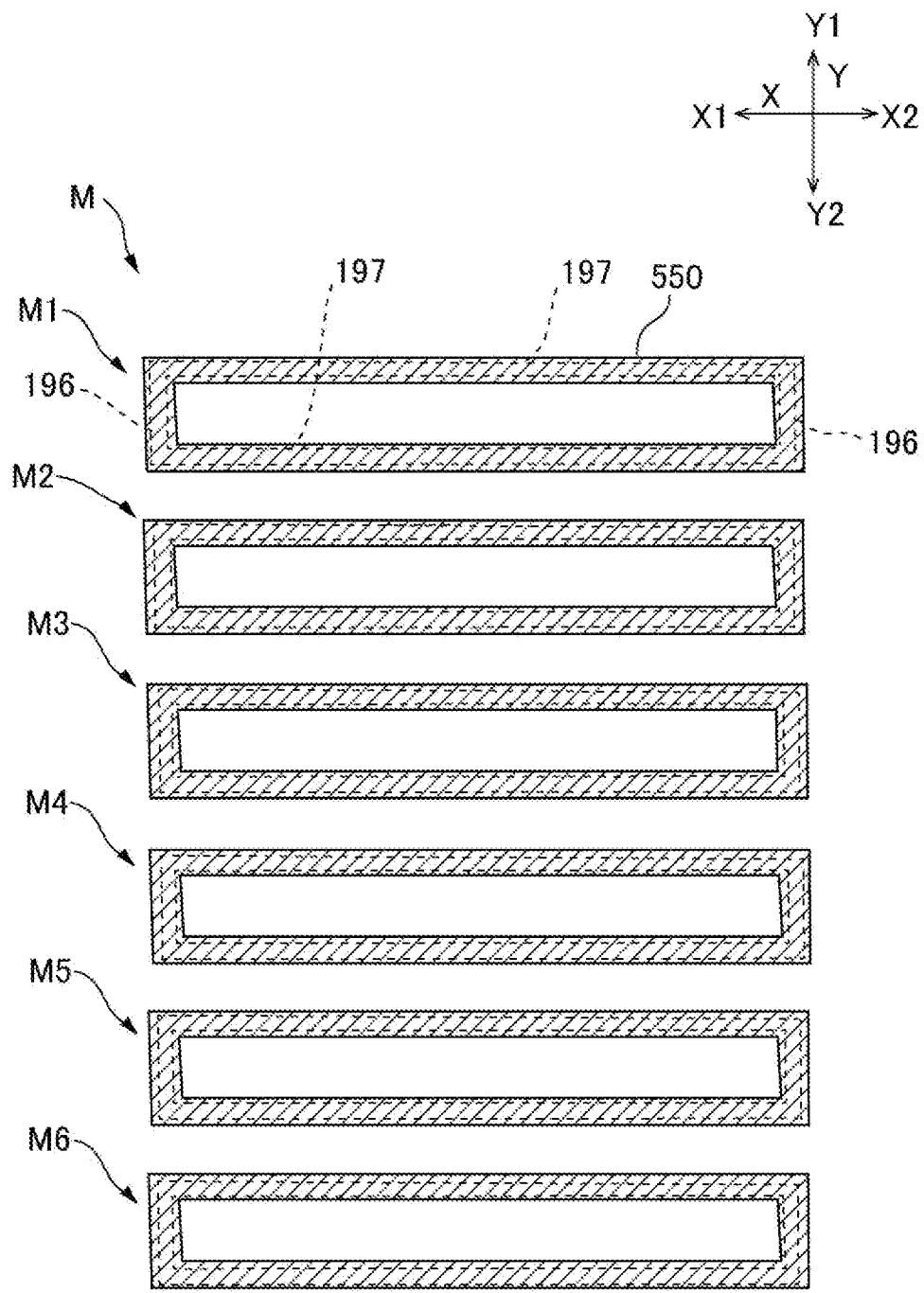
FIG. 14 is an explanatory view illustrating a fifth configuration example of the mark at the motherboard for an image device according to the present disclosure.

FIG. 14 is an explanatory view illustrating a fifth configuration example of the mark M at the motherboard 100 for an image device according to the present disclosure. The mark M illustrated in FIG. 14 corresponds to a modification example of the mark M illustrated in FIG. 13. In the case of the mark M illustrated in FIG. 13, the first grooves 196 and the second grooves 197 are not continuous. In the present exemplary embodiment, as illustrated in FIG. 14, the first grooves 196 and the second grooves 197 are continuous. However, the first grooves 196 and the second grooves 197 do not intersect with each other. Therefore, the wide portion 195z described with reference to FIG. 9 and FIG. 10 is less likely to be generated at the portion where the first groove 196 and the second groove 197 are continuous with each other, and hence the recessed portion 195 is readily filled with the filling film 40.

1-9. Sixth Configuration Example of Mark M

Figure 15:
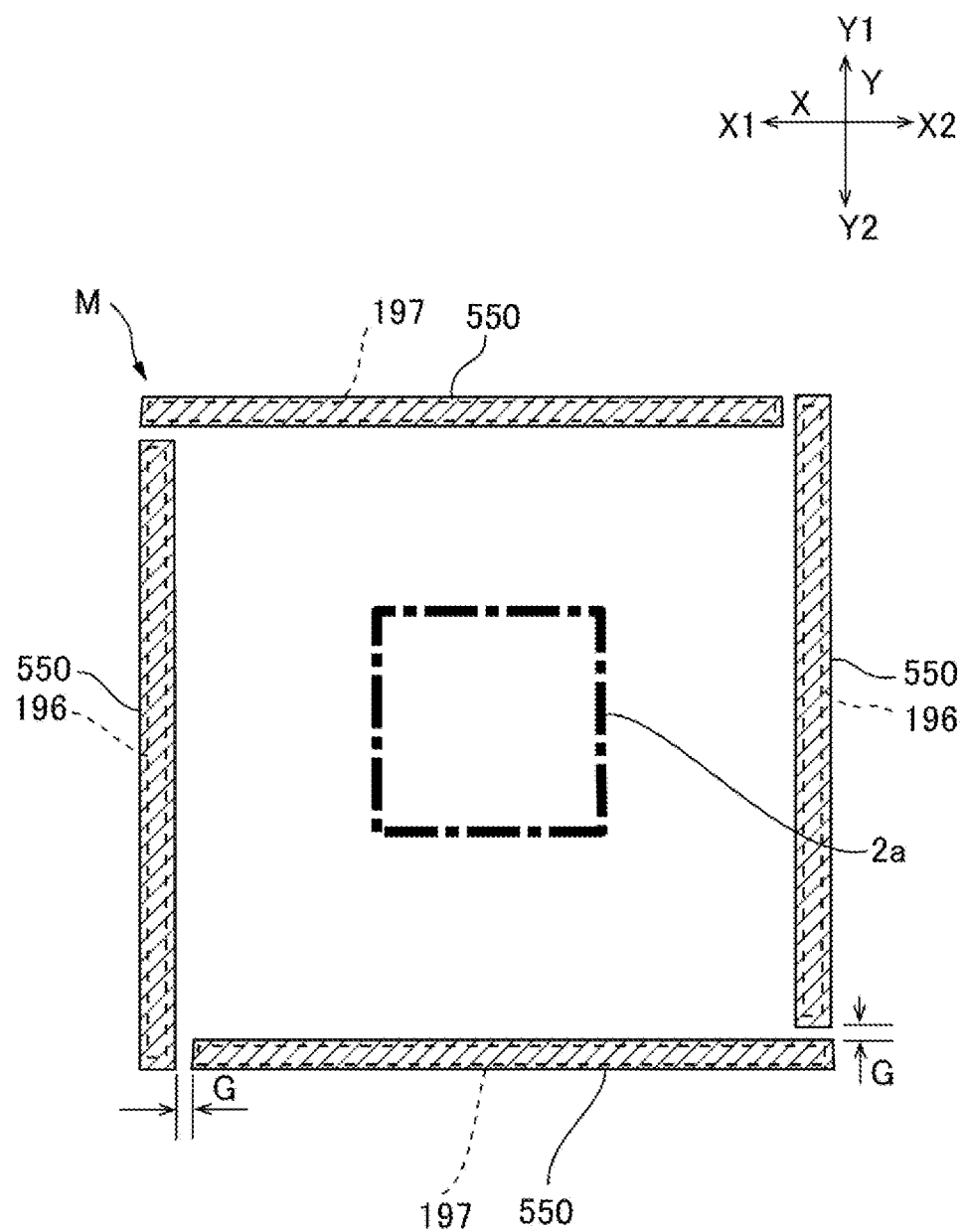
FIG. 15 is an explanatory view illustrating a sixth configuration example of the mark at the motherboard for an image device according to the present disclosure.

FIG. 15 is an explanatory view illustrating a sixth configuration example of the mark M at the motherboard 100 for an image device according to the present disclosure. In the present exemplary embodiment, the recessed portion 195 is also provided similarly to the exemplary embodiment described with reference to FIG. 7. Further, the recessed portion 195 includes the first grooves 196 extending in the first direction X and the second grooves 197 extending in the second direction Y intersecting with the first grooves 196, the second grooves 197 not intersecting with the first grooves 196. In the present exemplary embodiment, the recessed portion 195 includes the plurality of first grooves 196 and the plurality of second grooves 197. Further, the first grooves 196 and the second grooves 197 are alternately arranged. Therefore, the mark M has a quadrangular frame-like shape. Therefore, the mark M is used as an alignment mark. Further, the mark M has a frame-like shape. A photo-lithography technique is used to form a resin pattern 2a on an inner side of the mark M, and then positions of the resin pattern 2a and the mark M are inspected. With this, positional accuracy at the time of forming the resin pattern 2a by the photo-lithography technique can be evaluated.

In the present exemplary embodiment, the first groove 196 and the second groove 197 are away from each other across the gap G, and hence the first groove 196 and the second groove 197 do not intersect with each other. Thus, the recessed portion 195 does not include the wide portion 195z described with reference to FIG. 9 and FIG. 10. Therefore, as described with reference to FIG. 8, the recessed portion 195 is readily filled with the filling film 40, and hence a crack is less likely to be generated in the insulating film 41, for example. Thus, effects similar to those in the exemplary embodiment described with reference to FIG. 7 and FIG. 8 can be exerted. Moreover, the first grooves 196 and the second grooves 197 are arranged along the outline of the mark M, and hence widths of the first grooves 196 and the second grooves 197 are narrow. Therefore, according to the present exemplary embodiment, the recessed portion 195 is readily filled with the filling film 40, and hence an effect of lowering possibility of generating a crack in the insulating film 41 and other effects can be exerted.

1-10. Seventh Configuration Example of Mark M

Figure 16:
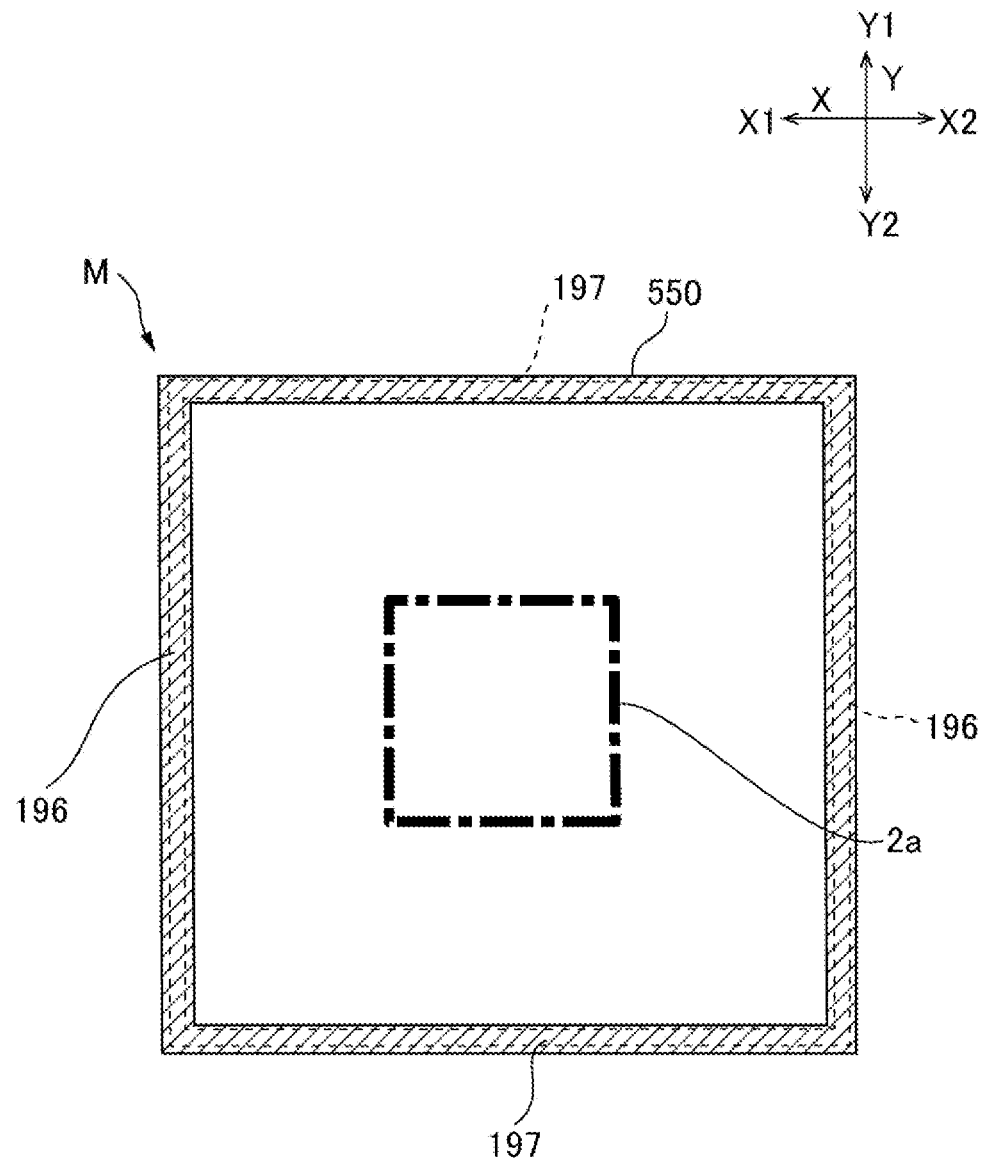
FIG. 16 is an explanatory view illustrating a seventh configuration example of the mark at the motherboard for an image device according to the present disclosure.

FIG. 16 is an explanatory view illustrating a seventh configuration example of the mark M at the motherboard 100 for an image device according to the present disclosure. The mark M illustrated in FIG. 16 corresponds to a modification example of the mark M illustrated in FIG. 15. In the case of the mark M illustrated in FIG. 15, the first grooves 196 and the second grooves 197 are not continuous. In the present exemplary embodiment, as illustrated in FIG. 16, the first grooves 196 and the second grooves 197 are continuous. However, the first grooves 196 and the second grooves 197 do not intersect with each other. Therefore, the wide portion 195z described with reference to FIG. 9 and FIG. 10 is less likely to be generated at the portion where the first groove 196 and the second groove 197 are continuous with each other, and hence the recessed portion 195 is readily filled with the filling film 40.

1-11. Configuration Example of Capacitance Element 55

Figure 17:
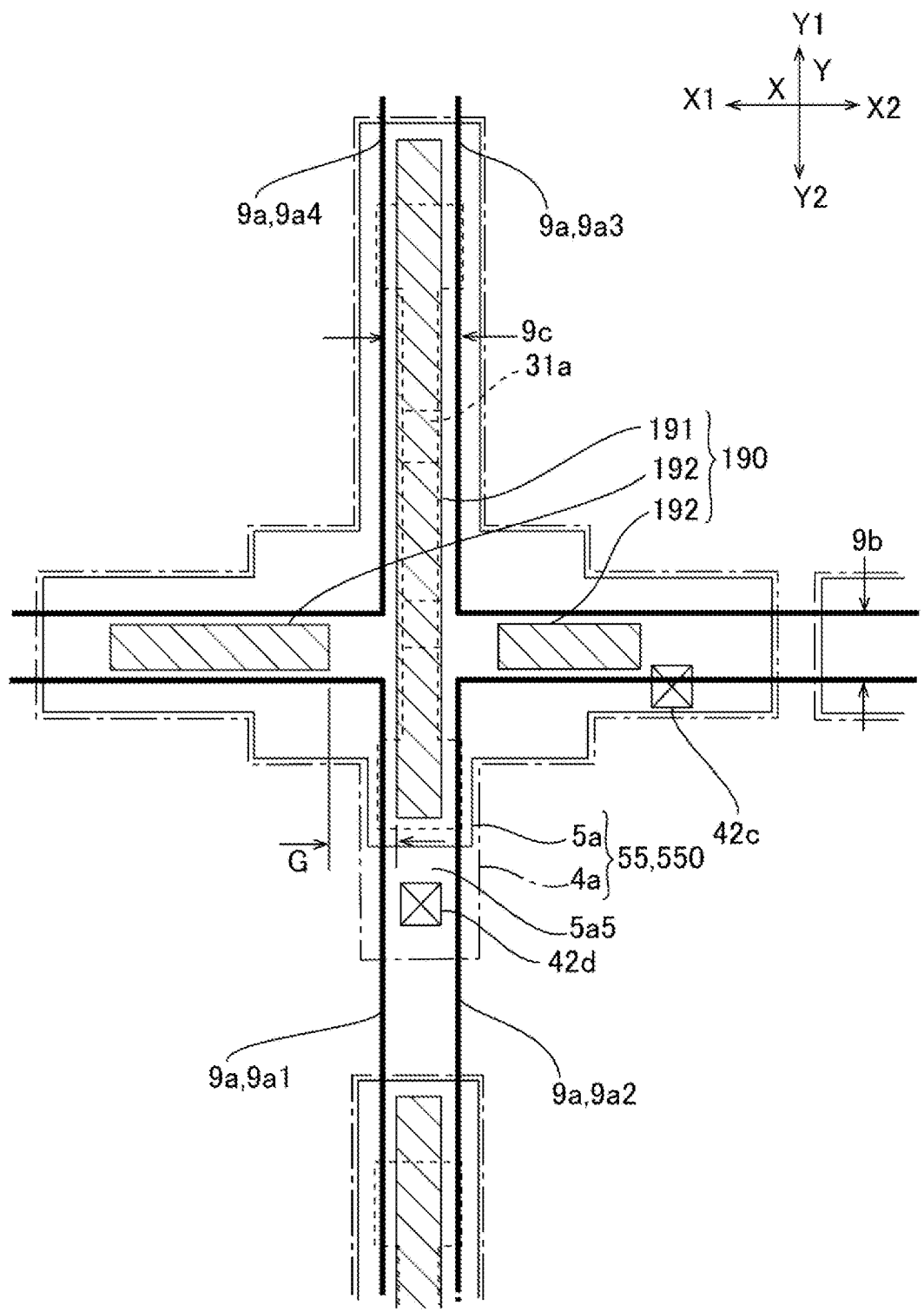
FIG. 17 is a plan view illustrating a configuration example of a capacitance element illustrated in FIG. 4 and FIG. 5.

FIG. 17 is a plan view illustrating a configuration example of the capacitance element 55 illustrated in FIG. 4 and FIG. 5. For forming the capacitance element 55 illustrated in FIG. 4 and FIG. 5, the mark M is formed on the outer side of the pixel area 10b at the same time when the recessed portion 190 is formed. As illustrated in FIG. 17, at the capacitance element 55, the recessed portion 190 is recessed in the region overlapping with the capacitance element 55 in plan view, toward the substrate body 19. The recessed portion 190 includes the first groove 191 extending in the first direction X and second grooves 192 extending in a direction different from the extending direction of the first groove 191. In the present exemplary embodiment, the first groove 191 linearly extends in the second direction Y so as to overlap with the semiconductor film 31a in plan view, and the plurality of second grooves 192 extend in the second direction Y on both sides of the first groove 191 in the width direction in the first direction X. Here, in the multi-layered film 550, the second conductive film 5a overlaps with a side wall and a bottom wall of each of the first groove 191 and the second grooves 192 via the insulating film 49 and the first conductive film 4a. Therefore, electrostatic capacitance of the capacitance element 55 is large. Further, depths of the first groove 191 and the second grooves 192 are deeper than the total film thickness of the multi-layered film 550, and the multi-layered film 550 is formed uniformly by the CVD method or the like. Thus, the capacitance element 55 with stable electrostatic capacitance can be configured.

Here, the second grooves 192 do not intersect with the first groove 191 extending in the second direction Y, and extend in the first direction X intersecting with the first groove 191. More specifically, the second grooves 192 are provided at positions away from the first groove 191 across the gap G in the first direction X, and hence do not intersect with the first groove 191. Therefore, groove widths of the first groove 191 and the second grooves 192 are narrow at any position. Therefore, as described with reference to FIG. 7 and FIG. 8, even in a case in which the recessed portion 5a6 generated by the first groove 191 and the second grooves 192 is generated in the surface of the second conductive film 5a, when the insulating film 41 is formed, the recessed portion 5a6 is readily filled with the insulating film 41 due to the portion accumulated on bottom walls and side walls of the first groove 191 and the second grooves 192. Therefore, even when chemical machine polishing is performed after formation of the insulating film 41 as in the present exemplary embodiment, a film thickness for forming the insulating film 41 can be reduced, and hence a time period for forming the insulating film 41 can be shortened. Further, it is only required to form the semiconductor film 31a into a flat shape, and hence chemical machine polishing for flattening the surface of the insulating film 41 is not required as long as the recessed portion 5a6 is filled. In the present exemplary embodiment, the insulating film 41 is formed of a silicon oxide film or the like, and is formed to have a film thickness from 0.2 μm to 0.5 μm. Further, the insulating film 41 has a shape excellent in a step property suitable for filling the recessed portion 5a6. Further, an opening width of the first groove 191 is from 0.6 μm to 1.0 μm, and a bottom wall width thereof is from 0.4 μm to 0.8 μm, and a depth thereof is from 1 μm to 2 μm.

1-12. Modification Example of Motherboard 100 for Image Device

Figure 18:
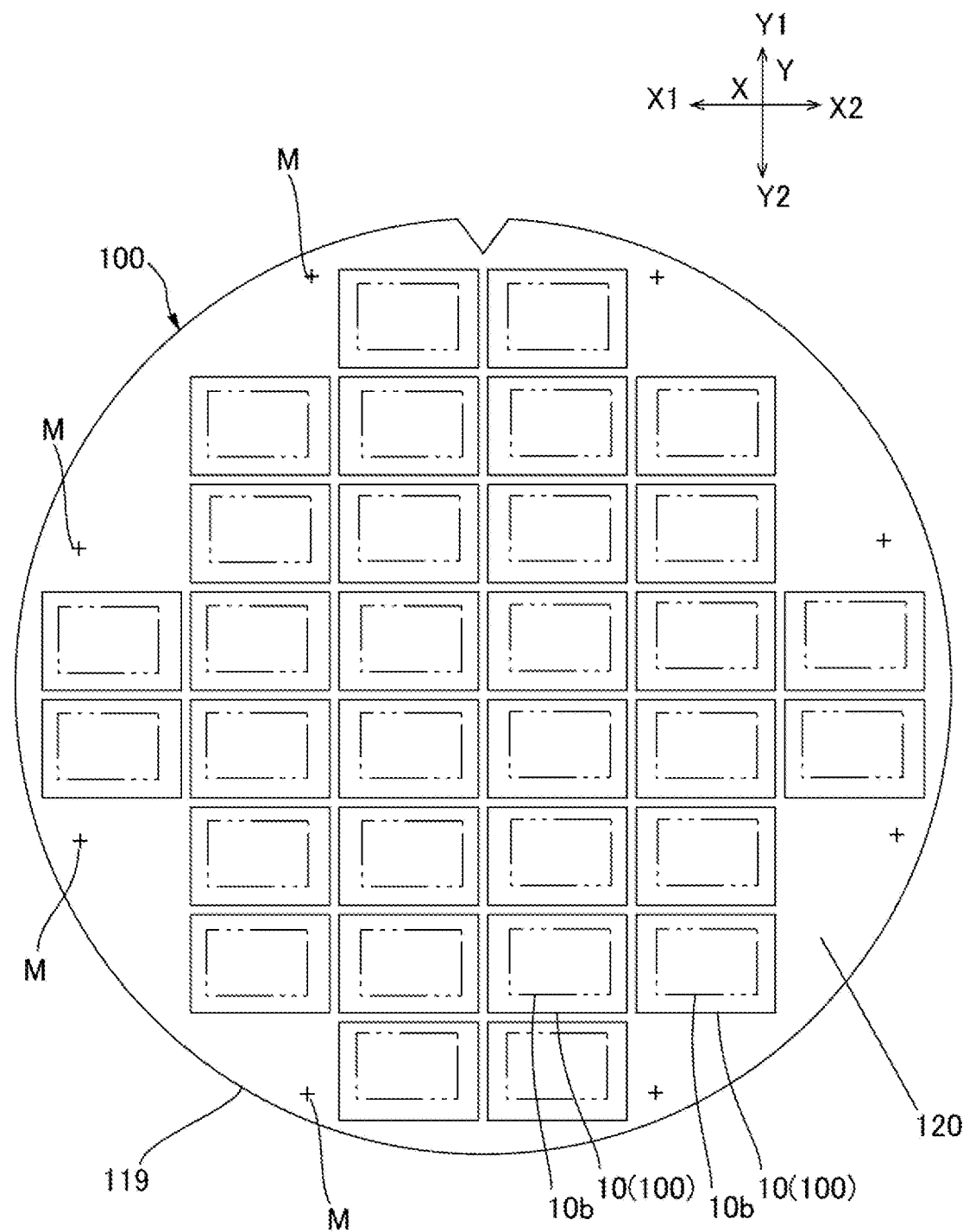
FIG. 18 is an explanatory view of a modification example of the motherboard for an image device illustrated in FIG. 6.

FIG. 18 is an explanatory view of a modification example of the motherboard 100 for an image device illustrated in FIG. 6. The motherboard 100 for an image device illustrated in FIG. 6 includes the marks M provided on the outer side of the pixel area 10b in each of the plurality of effective regions 110 that correspond to the element substrates 10 after division, while in the present exemplary embodiment, as illustrated in FIG. 18, the marks M are provided at the ineffective region 120 that is removed after division of the element substrates 10. Therefore, at the time when the image device 1 illustrated in FIG. 1 is configured, the mark M are not present in the image device 1.

Note that, in FIG. 18, the marks M are arranged on the outer sides of the effective regions 110 that correspond to the plurality of element substrates 10 after division, but the marks M may be provided between regions of the effective regions 110 that correspond to the element substrates 10 after division.

Figure 19:
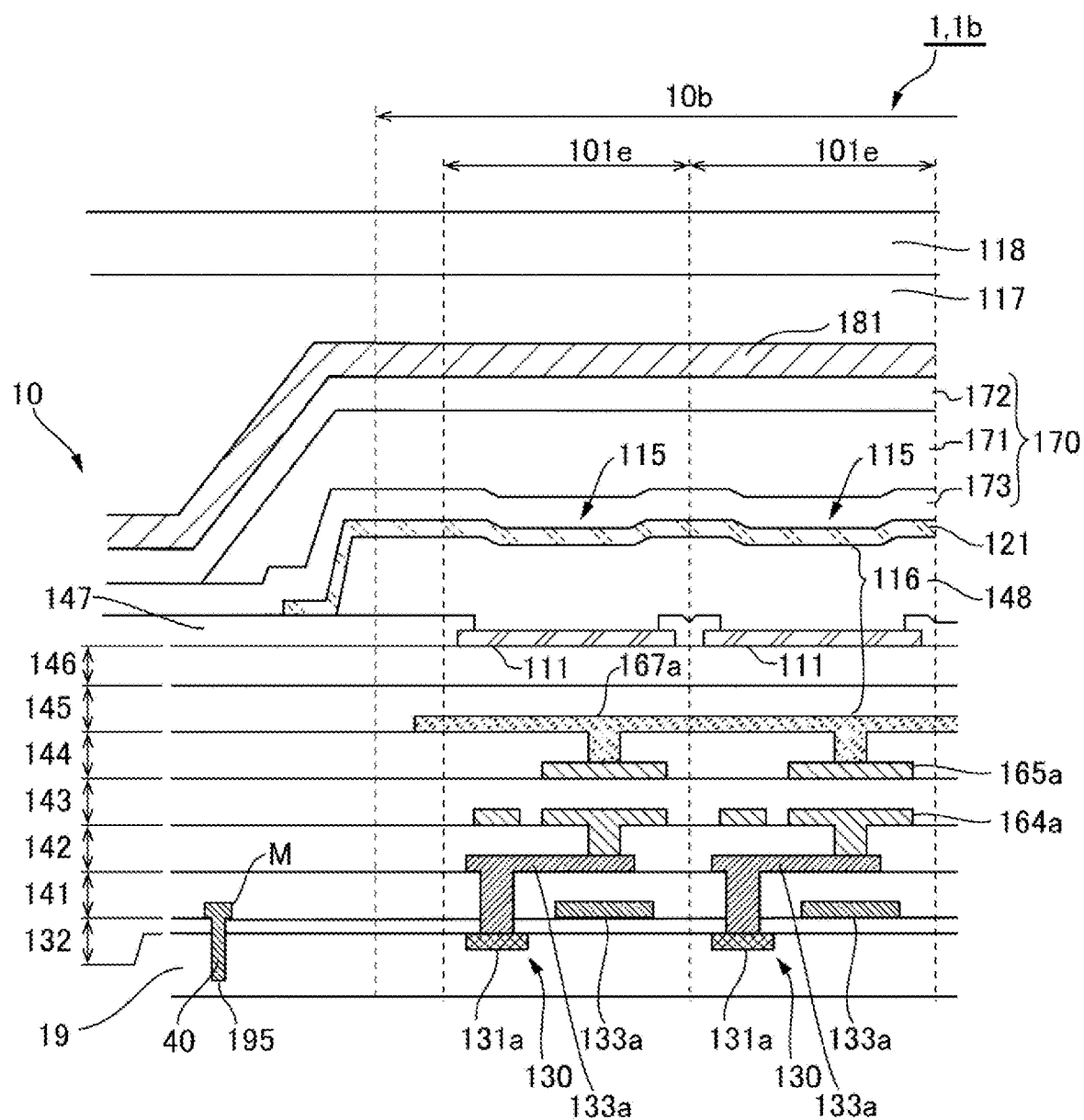
FIG. 19 is an explanatory view of an organic electroluminescence display device to which the present disclosure is applied.

2. Second Exemplary Embodiment: Application Example to Organic Electroluminescence Device 1b FIG. 19 is an explanatory view of the organic electroluminescence device 1b to which the present disclosure is applied. Note that, for describing the present exemplary embodiment and exemplary embodiments described later, an element substrate and a substrate body are described as the element substrate 10 and the substrate body 19, respectively, so that correspondence with the liquid crystal device 1a illustrated in FIG. 1 and FIG. 2 is easily understood.

The image device 1 illustrated in FIG. 19 corresponds to the organic electroluminescence device 1b. In the organic electroluminescence device 1b, the substrate body 19 of the element substrate 10 is provided with light-emitting elements 115 and the like, and an image is displayed by light emitted from the light-emitting elements 115.

In the present exemplary embodiment, at the substrate body 19, insulating films 141, 142, 143, 144, 145, 146, and 147 being transmissive and forming inter-layer insulating films and the like are layered. Further, at the substrate body 19, a semiconductor layer 131 forming a transistor 130 or the like of each of pixels 101e is formed, and the semiconductor layer 131 is covered with a gate insulating film 132. A gate electrode 133a is formed between the gate insulating film 132 and the insulating film 141. A relay electrode 133d or the like is formed between the insulating film 141 and the insulating film 142. A first capacitance electrode 164a or the like is formed between the insulating film 142 and the insulating film 143. A second capacitance electrode 165a or the like that faces the first capacitance electrode 164a via the insulating film 143 is formed between the insulating film 143 and the insulating film 144. A wiring line 167a or the like that is electrically coupled to the second capacitance electrode 165a and has a light reflection property is formed between the insulating film 144 and the insulating film 145. The insulating film 146 is a light path adjustment layer for setting a resonant wavelength of an optical resonator 116 to a predetermined wavelength.

A pixel electrode 111 forming the pixel 101e is formed between the insulating film 146 and the insulating film 147. The pixel electrode 111 is formed of a light-transmissive conductive material such as ITO. The insulating film 147 overlaps with an end of the pixel electrode 111, and defines a region of the pixel 101e. A light emission function layer 148 is formed at the pixel electrode 111. The light emission function layer 148 is continuously formed over the plurality of pixels 101e in the pixel area 10b. A common electrode 121 is formed at an upper layer of the light emission function layer 148 at an entirety of the pixel area 10b. The pixel electrode 111, the light emission function layer 148, and the common electrode 121 form the light-emitting element 115. At the light-emitting element 115, the light emission function layer 148 is configured to include a light-emitting layer formed of an organic EL material, and radiates white light as a result of the supply of current. A transport layer or an injection layer of electrons or positive holes supplied to the light-emitting layer may be provided in the light emission function layer 148.

The common electrode 121 transmits some of the light that has reached it, and also functions as a semitransparent reflection layer that reflects back the rest of the light. The radiated light from the light emission function layer 148 reciprocates between the wiring line 167a and the common electrode 121, and components of a particular resonant wavelength are selectively amplified. Then, the reciprocating light passes through the common electrode 121, and is emitted to a side opposite to the substrate body 19.

A sealing body 170 is formed at the upper layer side of the common electrode 121, over the entire area of the substrate body 19. The sealing body 170 is formed of a multi-layered film including a first sealing layer 171, a second sealing layer 172, and a third sealing layer 173. The third sealing layer 173 is an inorganic material having an insulating property such as a silicon oxide film. The first sealing layer 171 is a flattened film formed of a light-transmissive organic material such as an epoxy resin. The second sealing layer 172 is formed of silicon nitride, silicon oxide, or the like, which offers excellent water-resistant and heat-resistant properties, for example.

A colored layer 181 is formed at the upper surface of the sealing body 170. The colored layer 181 transmits light having a predetermined wavelength region. Further, a transmissive cover substrate 118 is fixed to the colored layer 181, on the opposite side to the substrate body 19, by an adhesive layer 117.

The organic electroluminescence device 1b thus configured is configured for, for example, red light, green light, or blue light, and is used in a projection-type display device or the like. Further, in the organic electroluminescence device 1b, a display device may be configured by associating each of the pixels 101e with red light, green light, or blue light.

In the organic electroluminescence device 1b thus configured, the electrodes and the like are also formed in the photo-lithography process, similarly to the liquid crystal device 1a. Therefore, similarly to the liquid crystal device 1a, the marks M illustrated in FIG. 6 to FIG. 16 are also formed at the effective regions 110 of the motherboard 100 for an image device in the organic electroluminescence device 1b. Further, as illustrated in FIG. 18, the marks M may be formed at the ineffective region 120 of the motherboard 100 for an image device. The mark M includes the recessed portion 195, and the recessed portion 195 is filled with the filling film 40 having a light-shielding property, which is formed of the same conductive film as the gate electrode 133a, for example. Note that, when the substrate body 19 is a substrate having a light-shielding property such as a silicon substrate and a ceramics substrate, the filling film 40 may be transmissive.

3. Third Exemplary Embodiment: Application Example to Mirror Device 1c

Figure 20:
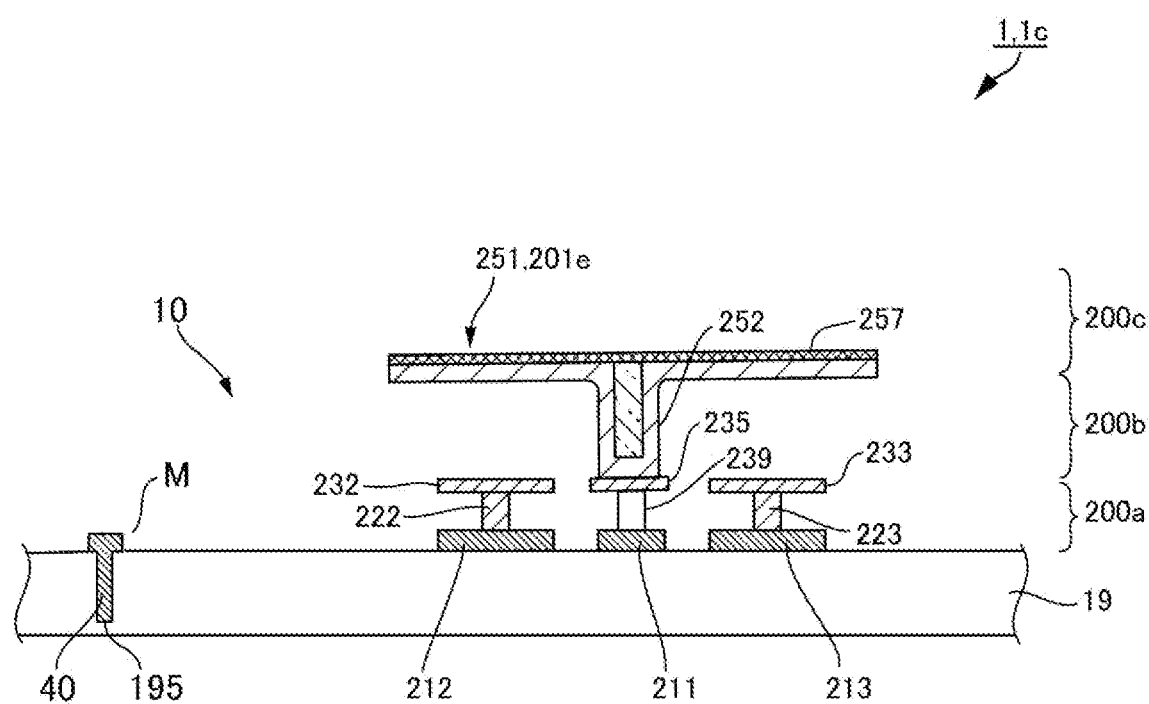
FIG. 20 is an explanatory view of a mirror device to which the present disclosure is applied.

FIG. 20 is an explanatory view of the mirror device 1c to which the present disclosure is applied. The image device 1 illustrated in FIG. 20 corresponds to the mirror device 1c. In the mirror device 1c, the substrate body 19 of the element substrate 10 is provided with mirrors 251, and an image is displayed by light reflected by the mirrors 251. In the mirror device 1c, the plurality of mirrors 251 are arranged in a matrix shape on one surface side of the substrate body 19, and one mirror 251 corresponds to one pixel 201e. The mirror 251 is away from the substrate body 19. The substrate body 19 is a silicon substrate, for example. The surface of the mirror 251 is a reflection surface 257 formed of a reflective metal film such as aluminum.

The mirror device 1c includes a first stage portion 200a including a substrate-side bias electrode 211, substrate-side address electrodes 212 and 213, and the like, a second stage portion 200b including elevated address electrodes 232 and 233 and a torsion hinge 235, and a third stage portion 200c including the mirror 251. At the first stage portion 200a, an address circuit (not illustrated) is formed at the substrate body 19. The second stage portion 200b includes the elevated address electrodes 232 and 233, the torsion hinge 235, and a mirror support portion 252. The elevated address electrodes 232 and 233 are conducted to the substrate-side address electrodes 212 and 213 via electrode posts 222 and 223, and are also supported by the substrate-side address electrodes 212 and 213.

A Hinge arm extends from both ends of the torsion hinge 235. The hinge arm is conducted to the substrate-side bias electrode 211 via a hinge support portion 239, and is also supported by the substrate-side bias electrode 211. The mirror 251 is conducted to the torsion hinge 235 via the mirror support portion 252, and is also supported by the torsion hinge 235. Therefore, the mirror 251 is conducted to the substrate-side bias electrode 211 via the mirror support portion 252, the torsion hinge 235, the hinge arm, and the hinge support portion 239, and a bias voltage is applied thereto from the substrate-side bias electrode 211.

In the mirror device 1c, the torsion hinge 235 is distorted when a drive voltage is applied to the substrate-side address electrodes 212 and 213 and the elevated address electrodes 232 and 233 and the mirror 251 is inclined so as to be attracted toward the substrate-side address electrode 212 and the elevated address electrode 232 or the substrate-side address electrode 212 and the elevated address electrode 233. Further, when application of a drive voltage to the substrate-side address electrodes 212 and 213 and the elevated address electrodes 232 and 233 is stopped and a suction force with respect to the mirror 251 is no longer present, a force of restoring the mirror 251 to a posture parallel to the substrate body 19 is exerted.

Here, when the mirror 251 is inclined toward the substrate-side address electrode 212 and the elevated address electrode 232, an on-state is established, where light emitted from a light source unit is reflected by the mirror 251 toward a projection optical system. In contrast, when the mirror 251 is inclined toward the substrate-side address electrode 213 and the elevated address electrode 233, an off-state is established, where light emitted from the light source unit is reflected by the mirror 251 toward a light absorption device. In the off-state, light is not reflected toward the projection optical system. As a result of such drive performed in each of the plurality of mirrors 251, light emitted from the light source unit is modulated to image light at the plurality of mirrors 251, and is projected from the projection optical system. In this manner, an image is displayed.

In the mirror device 1c thus configured, the electrodes and the like are also formed in the photo-lithography process, similarly to the liquid crystal device 1a. In this case, a sacrifice film is utilized to achieve a configuration in which the electrodes and the like, and the substrate body 19 are away from each other. Therefore, similarly to the liquid crystal device 1*a*, the marks M illustrated in FIG. 6 to FIG. 16 are also formed at the effective regions 110 of the motherboard 100 for an image device in the mirror device 1*c*. Further, as illustrated in FIG. 18, the marks M may be formed at the ineffective region 120 of the motherboard 100 for an image device. The mark M includes the recessed portion 195, and the recessed portion 195 is filled with the filling film 40 having a light-shielding property, which is formed of the same conductive film as the substrate-side address electrodes 212 and 213, for example. Note that, when the substrate body 19 is a substrate having a light-shielding property such as a silicon substrate and a ceramics substrate, the filling film 40 may be transmissive.

4. Fourth Exemplary Embodiment: Application Example to Image-Capturing Device 1*d*

Figure 21:
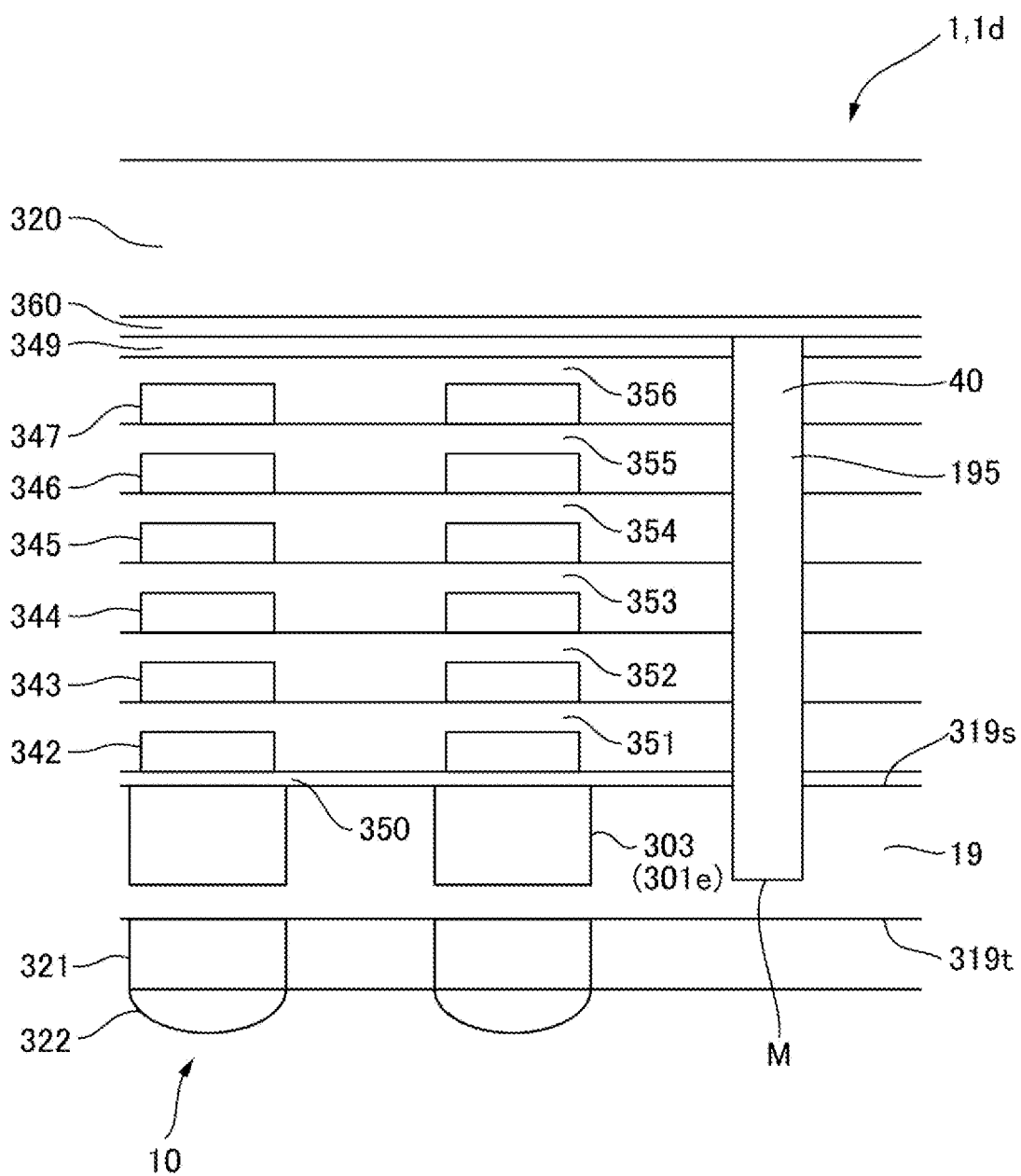
FIG. 21 is an explanatory view of an image-capturing device to which the present disclosure is applied.

FIG. 21 is an explanatory view of the image-capturing device 1*d* to which the present disclosure is applied. The image device 1 illustrated in FIG. 21 corresponds to the image-capturing device 1*d* including CMOS-type solid-state imaging elements. In the image-capturing device 1*d*, in the substrate body 19 of the element substrate 10, a plurality of photodiodes 303 as solid-state imaging elements are provided to a plurality of pixels 301*e*, respectively, and an image is captured by the plurality of photodiodes 303.

In the image-capturing device 1*d*, the substrate body 19 is formed of a silicon substrate. At the surface layer of the substrate body 19, the plurality of photodiodes 303 as a plurality of photoelectric conversion portions are formed in a matrix shape in a two-dimensional manner. A charge transfer transistor for transferring a signal charge from each of the photodiodes 303 is provided adjacent to the photodiode 303 in the substrate body 19. At a surface 319*s* of the substrate body 19, a gate insulating film 350 and a gate electrode 342 are provided. At the upper layer side of the gate electrode 342, an insulating film 351, a wiring line 343, an insulating film 352, a wiring line 344, an inter-layer insulating film 353, a wiring line 345, an insulating film 354, a wiring line 346, an insulating film 355, and a wiring line 347 are formed sequentially. Moreover, at the upper layer side of the wiring line 347, an insulating film 356 and a passivation film 349 are formed sequentially. Further, the wiring lines overlapping with each other via the insulating films are electrically coupled by a contact plug (not illustrated). At the passivation film 349, a support substrate 320 is provided via an adhesive layer 360.

A back surface 319*t* of the substrate body 19, a color filter 321 and a lens 322 are formed so as to overlap with each of the plurality of photodiodes 303. The color filter 321 and the lens 322 are formed in the photo-lithography process. Therefore, similarly to the liquid crystal device 1*a*, the marks M illustrated in FIG. 6 to FIG. 16 are also formed at the effective regions 110 of the motherboard 100 for an image device in the image-capturing device 1*d*. Further, as illustrated in FIG. 18, the marks M may be formed at the ineffective region 120 of the motherboard 100 for an image device.

In the present exemplary embodiment, the mark M includes the recessed portion 195 passing from the passivation film 349 to the substrate body 19. The recessed portion 195 reaches the inside of the substrate body 19. Here, the substrate body 19 has a light-shielding property. Therefore, the filling film 410 filling the inside of the recessed portion 195 is formed of an insulating film being transmissive. In this case, the substrate body 19 is thin at the bottom portion of the recessed portion 195, and hence is transmissive at a certain degree. Therefore, when the color filter 321 and the lens 322 are formed at the back surface 319*t* of the substrate body 19, the mark M can be observed from the back surface 319*t* side of the substrate body 19.

5. Configuration Example of Electronic Device

The liquid crystal device 1*a*, the organic electroluminescence device 1*b*, and the mirror device 1*c* are used in electronic devices such as a projection-type display device, a projection-type head up display, a direct-view-type head mounted display, a personal computer, and a digital still camera.

What is claimed is:

1. An image device comprising:
    a substrate body; and
    a mark including:
        a recessed portion provided in the substrate body and
        a filling film filled in the recessed portion, wherein
        the recessed portion includes:
            a first groove extending along a first direction and
            a second groove extending along a second direction intersecting with the first direction, the second groove disconnected from the first groove in a plan view,
    wherein
        a pixel electrode for applying a voltage to an electro-optical layer, a light-emitting element, a mirror, or a photoreceptor element is provided in a pixel.

2. The image device according to claim 1, wherein
    at least one of the first groove and the second groove is provided in plurality.

3. The image device according to claim 2, wherein
    a plurality of the first grooves and a plurality of the second grooves are provided.

4. The image device according to claim 3, wherein
    the plurality of the first grooves and the plurality of the second grooves are arranged along an outline of the mark.

5. The image device according to claim 1, wherein
    the first groove and the second groove are away from each other.

6. The image device according to claim 1, wherein
    the substrate body is transmissive, and
    the filling film includes a light-shielding film.

7. The image device according to claim 1, wherein
    the substrate body has a light-shielding property, and
    the filling film is transmissive.

8. A motherboard for an image device, the motherboard comprising:
    a motherboard main body; and
    a mark including:
        a recessed portion provided in the motherboard main body and
        a filling film filled in the recessed portion, wherein
        the recessed portion includes:
            a first groove extending along a first direction and
            a second groove extending along a second direction intersecting with the first direction, the second groove disconnected from the first groove in a plan view, wherein
    a pixel electrode for applying a voltage to an electro-optical layer, a light-emitting element, a mirror, or a photoreceptor element is provided in a pixel.
9. An image device comprising:
a substrate body including:
    a first recess provided in a pixel region, and
    a second recess provided outside the pixel region;
a capacitance element including a multi-layered film provided in the first recess; and
a mark including a filling film in the second recess including a multi-layered film identical to the multi-layered film constituting the capacitance element, wherein
the first recess includes:
    a first groove extends along a first direction, and
    a second groove extends along a second direction that intersects the first direction and disconnects from the first groove in a planar view, and
the second recess includes:
    a third groove extends along the first direction, and
    a fourth groove extends along the second direction and connects to the third groove in the planar view.

10. The imaging device according to claim 9, wherein the second groove of the first recess is provided at a position away from the first groove of the first recess.

11. The imaging device according to claim 9, wherein in the second recess, the third groove is provided to connect to one of an opposing side surfaces of the fourth groove, and the fourth groove is provided to connect to one of an opposing side surfaces of the third groove.

12. The imaging device according to claim 9, wherein in the second recess, the third groove and the fourth groove are alternately arranged along an outer edge of the mark.

* * * * *